(12) United States Patent
Iguchi et al.

(10) Patent No.: US 11,152,391 B2
(45) Date of Patent: Oct. 19, 2021

(54) SEMICONDUCTOR MEMORY DEVICE AND PRODUCTION METHOD THEREOF

(71) Applicant: Toshiba Memory Corporation, Minato-ku (JP)

(72) Inventors: Tadashi Iguchi, Yokkaichi (JP); Murato Kawai, Yokkaichi (JP); Toru Matsuda, Yokkaichi (JP); Hisashi Kato, Mie (JP); Megumi Ishiduki, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/993,398

(22) Filed: Aug. 14, 2020

(65) Prior Publication Data

US 2020/0373327 A1    Nov. 26, 2020

Related U.S. Application Data

(63) Continuation of application No. 16/183,389, filed on Nov. 7, 2018, now abandoned, which is a
(Continued)

(51) Int. Cl.
| | | |
|---|---|---|
| *H01L 27/11565* | (2017.01) | |
| *H01L 27/11582* | (2017.01) | |
| *G11C 16/04* | (2006.01) | |
| *H01L 23/522* | (2006.01) | |
| *H01L 27/11575* | (2017.01) | |

(Continued)

(52) U.S. Cl.
CPC .... *H01L 27/11582* (2013.01); *G11C 16/0483* (2013.01); *H01L 23/5226* (2013.01); *H01L 27/11575* (2013.01); *H01L 21/764* (2013.01); *H01L 27/11551* (2013.01); *H01L 27/11556* (2013.01); *H01L 27/11565* (2013.01); *H01L 27/11578* (2013.01); *H01L 29/7926* (2013.01)

(58) Field of Classification Search
CPC ........... H01L 27/11565; H01L 23/5226; H01L 27/11582; H01L 27/11575; H01L 29/7926
See application file for complete search history.

(56) References Cited

U.S. PATENT DOCUMENTS

| | | | | | |
|---|---|---|---|---|---|
| 5,602,051 | A | * | 2/1997 | Cronin | .............. H01L 27/10808 438/396 |
| 5,707,885 | A | * | 1/1998 | Lim | .................. H01L 29/78642 438/155 |

(Continued)

FOREIGN PATENT DOCUMENTS

JP    2014-27104    2/2014

*Primary Examiner* — Mary A Wilczewski
*Assistant Examiner* — Tsz K Chiu
(74) *Attorney, Agent, or Firm* — Oblon, McClelland, Maier & Neustadt, L.L.P.

(57) ABSTRACT

A method of producing a semiconductor memory device includes, when three directions crossing each other are set to first, second, and third directions, respectively, laminating a plurality of first laminates and a plurality of second laminates on a semiconductor substrate in the third direction. The method further includes forming ends of the plurality of first laminates in shapes of steps extending in the first direction, and forming ends of the plurality of second laminates in shapes of steps extending in both directions of the first direction and the second direction.

8 Claims, 27 Drawing Sheets

Related U.S. Application Data continuation of application No. 14/849,743, filed on Sep. 10, 2015, now Pat. No. 10,147,735.

(60) Provisional application No. 62/132,886, filed on Mar. 13, 2015.

(51) Int. Cl.

| | | |
|---|---|---|
| H01L 29/792 | (2006.01) | |
| H01L 21/764 | (2006.01) | |
| H01L 27/11551 | (2017.01) | |
| H01L 27/11578 | (2017.01) | |
| H01L 27/11556 | (2017.01) | |

(56) References Cited

U.S. PATENT DOCUMENTS

| | | | | |
|---|---|---|---|---|
| 8,564,050 B2* | 10/2013 | Park | ............... | H01L 27/11548 |
| | | | | 257/329 |
| 8,704,288 B2 | 4/2014 | Lee | | |
| 8,750,044 B2 | 6/2014 | Choi | | |
| 9,029,938 B2* | 5/2015 | Nakaki | ............... | H01L 29/792 |
| | | | | 257/326 |
| 9,601,370 B2* | 3/2017 | Kato | ............... | H01L 27/11582 |
| 9,831,121 B2* | 11/2017 | Okawa | ............... | H01L 23/5226 |
| 9,929,043 B2* | 3/2018 | Ito | ............... | H01L 29/42344 |
| 10,032,791 B2* | 7/2018 | Lee | ............... | H01L 27/11575 |
| 10,483,124 B2* | 11/2019 | Sawano | ............... | H01L 27/11556 |
| 10,840,252 B2* | 11/2020 | Kim | ............... | H01L 27/11575 |
| 11,037,948 B2* | 6/2021 | Matsushita | ............... | H01L 21/31144 |
| 2002/0024093 A1* | 2/2002 | Ahn | ............... | H01L 27/10855 |
| | | | | 257/332 |
| 2009/0020744 A1* | 1/2009 | Mizukami | ............... | H01L 21/76805 |
| | | | | 257/4 |
| 2009/0121271 A1* | 5/2009 | Son | ............... | H01L 21/8221 |
| | | | | 257/315 |
| 2009/0310415 A1 | 12/2009 | Jin | | |
| 2010/0195395 A1 | 8/2010 | Jeong | | |
| 2011/0156132 A1* | 6/2011 | Kiyotoshi | ............... | H01L 27/11582 |
| | | | | 257/326 |
| 2011/0244666 A1 | 10/2011 | Kim et al. | | |
| 2012/0119283 A1* | 5/2012 | Lee | ............... | H01L 27/11565 |
| | | | | 257/316 |
| 2012/0140562 A1 | 6/2012 | Choe | | |
| 2012/0184078 A1* | 7/2012 | Kiyotoshi | ............... | H01L 27/11573 |
| | | | | 438/268 |
| 2012/0319173 A1* | 12/2012 | Ko | ............... | H01L 27/11575 |
| | | | | 257/211 |
| 2013/0056818 A1* | 3/2013 | Iino | ............... | H01L 27/1157 |
| | | | | 257/324 |
| 2013/0127011 A1 | 5/2013 | Higashitani | | |
| 2014/0027838 A1* | 1/2014 | Kido | ............... | H01L 27/0688 |
| | | | | 257/329 |
| 2015/0061068 A1* | 3/2015 | Akutsu | ............... | H01L 27/11565 |
| | | | | 257/499 |

\* cited by examiner

SEMICONDUCTOR MEMORY DEVICE AND PRODUCTION METHOD THEREOF

CROSS-REFERENCE TO DELATED APPLICATIONS

This application is a continuation of U.S. application Ser. No. 16/183,389, filed Nov. 7, 2018, which is a continuation of U.S. application Ser. No. 14/849,743, filed Sep. 10, 2015, which is based upon and claims the benefit of priority from U.S. Provisional Application 62/132,886, filed on Mar. 13, 2015, the entire contents of each which are incorporated herein by reference.

BACKGROUND

Field

The present invention relates to a semiconductor memory device and a production method thereof.

Description of the Related Art

As one of semiconductor memory devices, a flash memory has been known. Particularly, a NAND-type flash memory has been widely used generally, because the NAND-type flash memory has a low cost and a high capacity. A large number of technologies for increasing a capacity of the NAND-type flash memory have been suggested. One of the technologies is a structure in which memory cells are arranged three-dimensionally.

DETAILED DESCRIPTION

A semiconductor memory device according to an embodiment includes a memory cell array configured to have a memory string obtained by connecting a plurality of first selection transistors, a plurality of memory transistors, and a plurality of second selection transistors in series. When three directions crossing each other are set to first, second, and third directions, respectively, the memory cell array has a plurality of first conductive layers to be control gates of the plurality of first selection transistors, a plurality of second conductive layers to be control gates of the plurality of memory transistors, and a plurality of third conductive layers to be control gates of the plurality of second selection transistors, which are laminated in the third direction. Ends of the plurality of first conductive layers and ends of the plurality of third conductive layers are formed in shapes of steps extending in the first direction and ends of the plurality of second conductive layers are formed in shapes of steps extending in both directions of the first direction and the second direction.

Hereinafter, a semiconductor memory device and a production method thereof according to an embodiment of an embodiment will be described with reference to the drawings.

Configuration of Semiconductor Memory Device According to Embodiment

First, an entire configuration of a semiconductor memory device according to an embodiment will be described.

Figure 1:
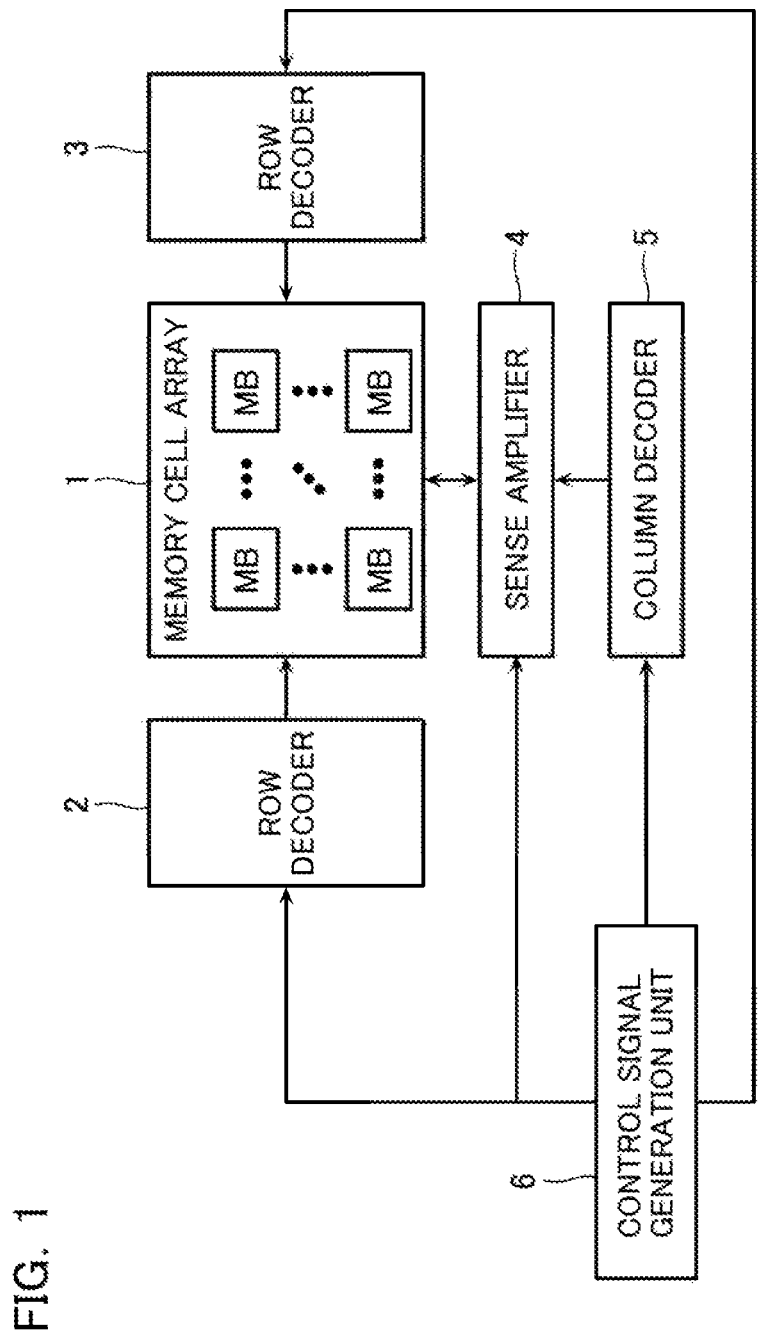
FIG. 1 a functional block diagram of a semiconductor memory device according to an embodiment.

FIG. 1 is a functional block diagram of the semiconductor memory device according to the embodiment.

The semiconductor memory device according to the embodiment includes a memory cell array 1, row decoders 2 and 3, a sense amplifier 4, a column decoder 5, and a control signal generating unit 6. The memory cell array 1 has a plurality of memory blocks MB. Each memory block MB has a plurality of memory transistors MT to be a plurality of memory cells MC arranged three-dimensionally and becomes a unit of an erasure operation of data. The individual memory blocks MB are divided by a plurality of grooves extending in one direction. Hereinafter, an area interposed between adjacent grooves is called a "finger". The row decoders 2 and 3 decode a block address signal taken and control a write operation and a read operation of data of the memory cell array 1. The sense amplifier 4 detects an electric signal flowing to the memory cell array 1 at the time of the read operation and amplifies the electric signal. The column decoder 5 decodes a column address signal and controls the sense amplifier 4. The control signal generating unit 6 boosts a reference voltage to generate a high voltage used at the time of the write operation or an erasure operation and generates a control signal to control the row decoders 2 and 3, the sense amplifier 4, and the column decoder 5.

Next, the memory cell array 1 will be described.

Figure 2:
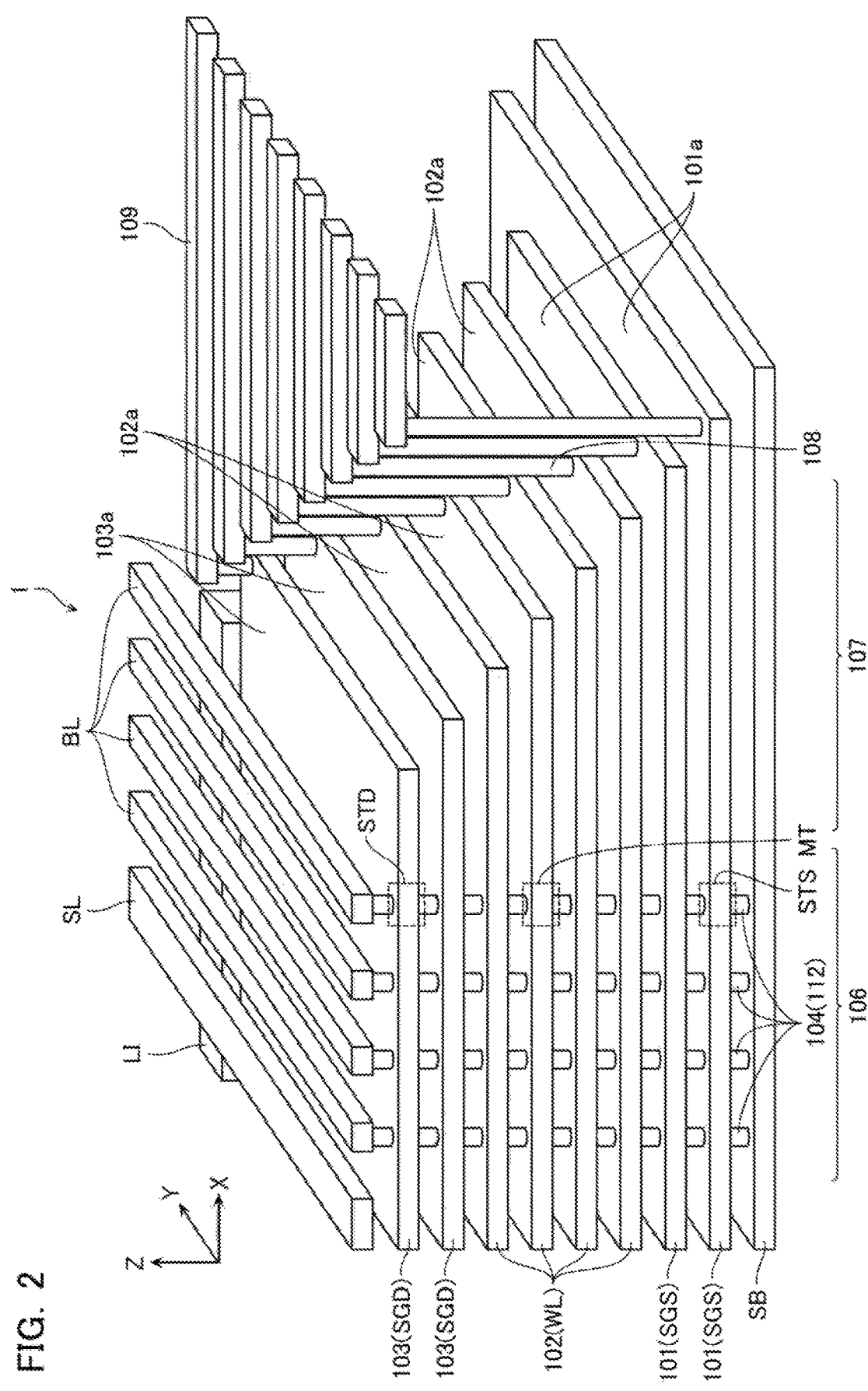
FIG. 2 is a perspective view illustrating a structure of a memory cell array in a semiconductor memory device according to an embodiment.

FIG. 2 is a perspective view illustrating a structure of the memory cell array in the semiconductor memory device according to the embodiment. FIG. 2 illustrates an example of the structure of the memory cell array 1 and the number of each configuration is not limited.

As illustrated in FIG. 2, the memory cell array 1 has a semiconductor substrate SB and a plurality of conductive layers 101 (first conductive layers), a plurality of conductive layers 102 (second conductive layers), and a plurality of conductive layers 103 (third conductive layers) laminated on the semiconductor substrate SB in a Z direction (third direction). The conductive layers 101 to 103 are formed of tungsten (W) or polysilicon (Poly-Si), for example. The conductive layer 101 functions as a source-side selection gate line SGS. The conductive layer 102 functions as a word line WL. The conductive layer 103 functions as a drain-side selection gate line SGD. Hereinafter, the source-side selection gate line SGS and the drain-side selection gate line SGD are called "selection gate lines".

The memory cell array 1 has a plurality of memory columnar bodies 104 extending in the Z direction. A crossing part of the conductive layer 101 and the memory columnar body 104 functions as a source-side selection transistor STS. A crossing part of the conductive layer 102 and the memory columnar body 104 functions as the memory transistor MT. A crossing part of the conductive layer 103 and the memory columnar body 104 functions as a drain-side selection transistor STD. Hereinafter, the source-side selection transistor STS and the drain-side selection transistor STD are called "selection transistors".

In addition, the plurality of conductive layers 101 to 103 have contact units 101a to 103a in which ends thereof are formed in shapes of steps, respectively. The contact units 101a to 103a have portions that do not face bottom surfaces of other contact units 101a to 103a positioned at upper layers. These portions are called "terraces" hereinafter.

Wiring lines of the conductive layers 101 to 103 have terraces at different positions in an X direction and a Y direction and vias 108 are connected to the terraces to prevent the vias 108 from interfering with each other. Wiring lines 109 are arranged on upper ends of the vias 108. The via 108 and the wiring line 109 are formed of tungsten (W).

In addition, the memory cell array 1 has a source contact LI that faces sides of the Y direction of the plurality of conductive layers 101 to 103 and extends in the X direction. A bottom surface of the source contact LI contacts the semiconductor substrate SB. The conductive layer 108 is formed of tungsten (W), for example.

In addition, the memory cell array 1 has a plurality of bit lines BL and a source line SL that are arranged on the conductive layers 101 to 103 and the memory columnar bodies 104 and extend in the X direction and the Y direction. The memory columnar body 104 is electrically connected to a bottom surface of each bit line BL. The bit line BL is formed of tungsten (W), for example. The source contact LI is electrically connected to a bottom surface of the source line SL. The source line SL is formed of tungsten (W), for example.

Hereinafter, in the memory cell array 1, an area in which the plurality of memory columnar bodies 104 are arranged is called a "memory area 106" and an area in which the contact units 101a to 103a of the plurality of conductive layers 101 to 103 are formed is called a "contact area 107".

Next, the memory columnar body 104 and a peripheral structure thereof will be described.

Figure 3:
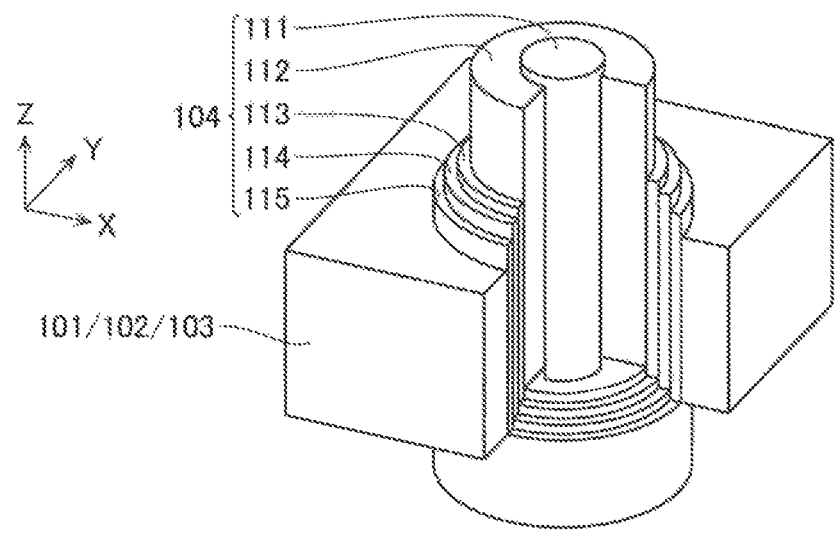
FIG. 3 is a perspective view illustrating a memory columnar body of a memory cell array and a peripheral structure thereof in a semiconductor memory device according to an embodiment.

FIG. 3 is a perspective view illustrating the memory columnar body of the memory cell array and the peripheral structure thereof in the semiconductor memory device according to the embodiment.

The memory columnar body 104 has an oxide film core 111, a semiconductor film 112, a tunnel insulating film 113, a charge accumulation film 114, and a block insulating film 115, which are laminated outward from the center. The oxide film core 111 can be formed of a silicon oxide film ($SiO_2$), for example. The semiconductor film 112 can be formed of silicon (Si), silicon germanium (SiGe), silicon carbide (SiC), germanium (Ge), and carbon (C). The tunnel insulating film 113 and the block insulating film 115 can be formed of $Al_2O_3$, $Y_2O_3$, $La_2O_3$, $Gd_2O_3$, $Ce_2O_3$, $CeO_2$, $Ta_2O_3$, $HfO_2$, $ZrO_2$, $TiO_2$, HfSiO, HfAlO, ZrSiO, ZrAlO, and AlSiO, in addition to a silicon oxide film ($SiO_x$). The charge accumulation film 114 can be formed of a silicon nitride film (SiN), for example. The tunnel insulating film 113 and the charge accumulation film 114 may be formed in a longitudinal direction of the memory columnar body 104 or may be formed at only positions of sides of the conductive layers 101 to 103.

By the structure described using FIGS. 2 and 3, the source-side selection transistor STS is formed in the crossing part of the conductive layer 101 and the memory columnar body 104. The memory transistor MT is formed in the crossing part of the conductive layer 102 and the memory columnar body 104. The drain-side selection transistor STD is formed in the crossing part of the conductive layer 103 and the memory columnar body 104. Hereinafter, a collection of the plurality of memory transistors MT sharing one memory columnar body 104 is called as a "memory string MS" and a collection of the memory string MS sharing one memory columnar body 104 and the selection transistors STS and STD is called a "memory unit MU".

Next, an equivalent circuit of the memory unit MU will be described.

Figure 4:
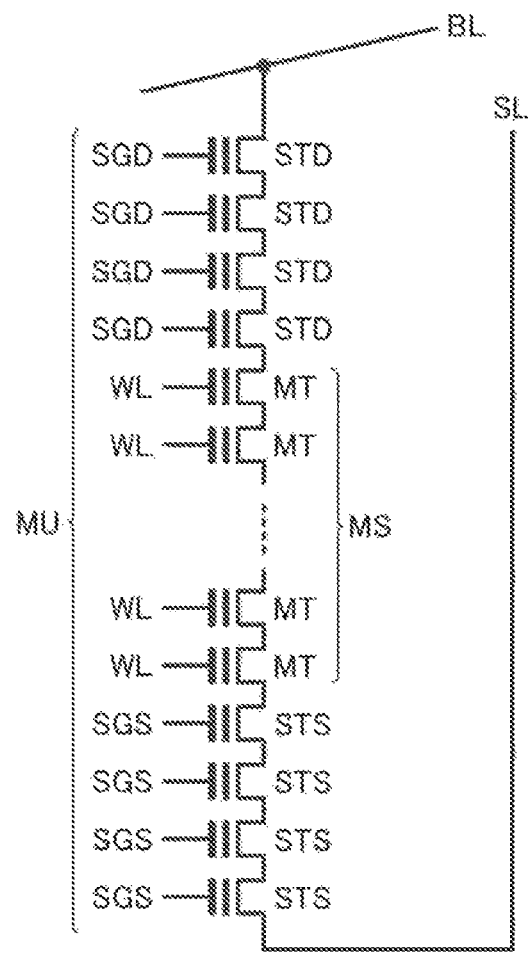
FIG. 4 is an equivalent circuit diagram of a memory unit of a memory cell array in a semiconductor memory device according to an embodiment.

FIG. 4 is an equivalent circuit diagram of the memory unit of the memory cell array in the semiconductor memory device according to the embodiment.

Each memory unit MU of the memory cell array 1 has a memory string MS including a plurality of memory transistors MT, a plurality of source-side selection transistors STS connected between a lower end of the memory string MS and the source line SL, and a plurality of drain-side selection transistors STD connected between an upper end of the memory string MS and the bit line BL. The source-side selection transistor STS, the memory transistor MT, and the drain-side selection transistor STD are connected in series from the source line SL to the bit line BL.

From the viewpoint of processing easiness of the memory cell array 1, it becomes advantageous to form the selection gate line SGS and SGD to have the small film thickness and the same film thickness as the film thickness of the word line WL. In this case, however, sufficient cutoff cannot be achieved by only one selection transistor. For this reason, in the memory unit MU according to the embodiment, the plurality of source-side selection transistors STS and the plurality of drain-side selection transistors STD are connected in series.

Hereinafter, structures of the contact units 101a to 103a according to the embodiment will be described. As the premise, structures of contact units according to two comparative examples will be described hereinafter.

Figure 5:
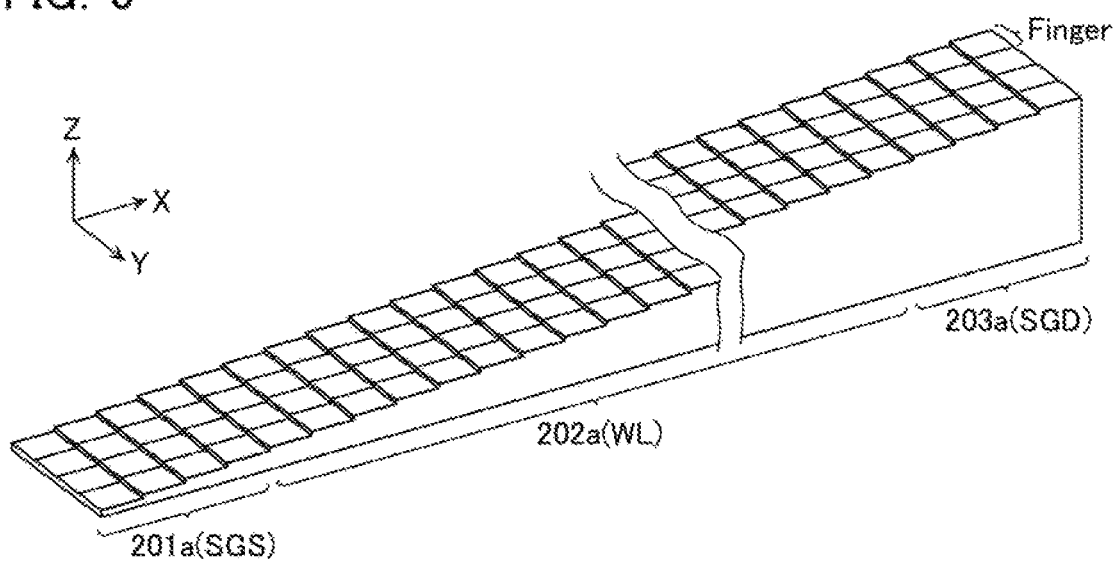
FIG. 5 is a perspective view illustrating a structure of a contact unit of a memory cell array in a semiconductor memory device according to a comparative example with respect to an embodiment.

FIG. 5 is a perspective view illustrating a structure of a contact unit of a memory cell array in a semiconductor memory device according to a first comparative example with respect to the embodiment. In the case of FIG. 5, one memory block is configured by four fingers.

Similar to the embodiment, the memory cell array according to the first comparative example has a plurality of conductive layers 201 becoming source-side selection gate lines SGS, a plurality of conductive layers 202 becoming word lines WL, and four conductive layers 203 becoming drain-side selection gate lines SGD, which are laminated from a lower layer to an upper layer. Ends of contact units 201a to 203a of the conductive layers 201 to 203 have stepwise structures extending in an X direction. In this case, because each of the conductive layers 201 to 203 can be divided into a plurality of parts (in the case of FIG. 5, four parts) in a Y direction, the selection gate lines SGS and SGD and the word line WL can be selected in units of fingers. However, in the case of the first comparative example, because the contact units 201a to 203a extend long in the X direction, this leads to increasing a chip size.

Similar to the embodiment, a memory cell array (not illustrated in the drawings) according to a second comparative example has conductive layers 301 becoming source-side selection gate lines SGS, conductive layers 302 becoming word lines WL, and conductive layers 303 becoming drain-side selection gate lines SGD, which are laminated from a lower layer to an upper layer. However, different from the first comparative example, ends of contact units 301a to 303a of the conductive layers 301 to 303 have stepwise structures extending in both directions of an X direction and a Y direction. That is, a terrace of each wiring line is arranged in a checkerboard pattern, when viewed from the Z direction. In this case, because contact areas for the conductive layers 301 to 303 can be decreased, the chip size can be decreased as compared with the first comparative example. However, in the case of the second comparative example, because the contact units 301a to 303a cannot be divided into a plurality of parts, the selection gate Lines SGS and SGD and the word line WL can be selected in only units of memory blocks MB. In this case, load to a memory string MS at the time of a read operation and a write operation becomes several times larger than load in the first comparison example.

Therefore, in this embodiment, the contact units 101a to 103a of the conductive layers 101 to 103 have the following structures.

Figure 6:
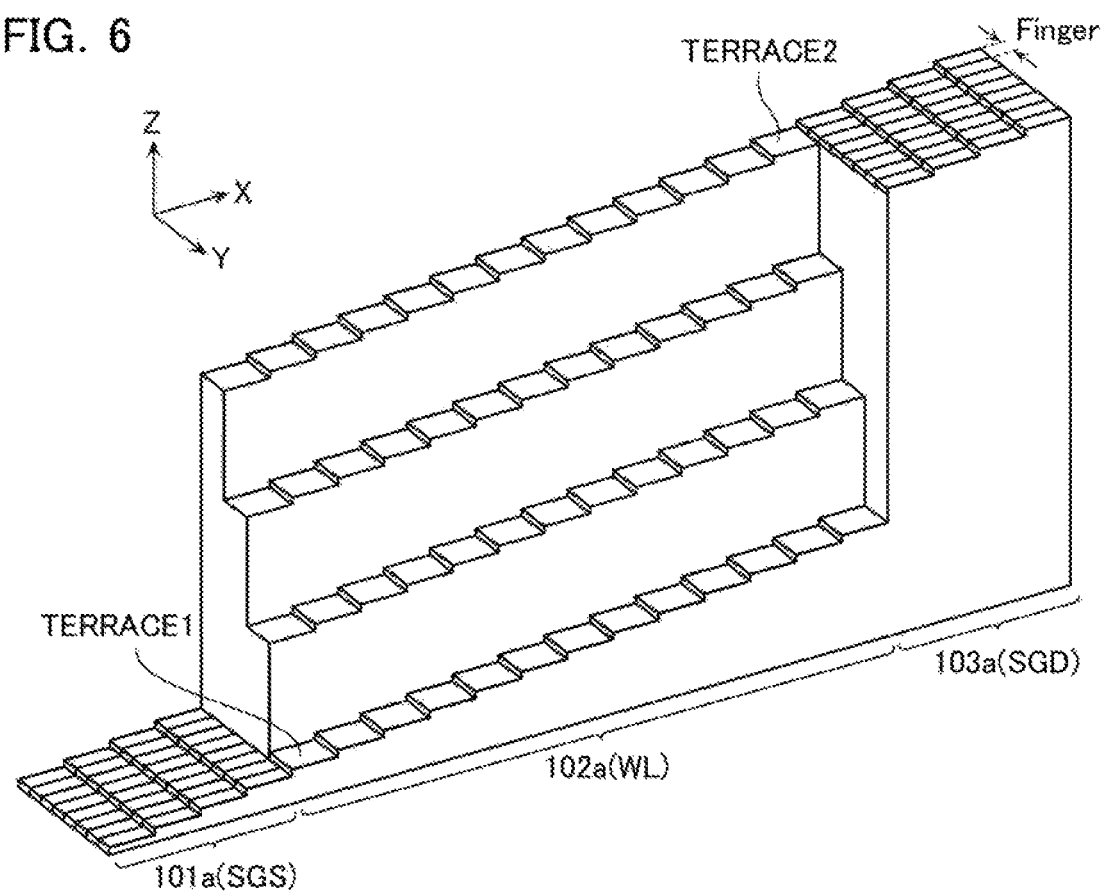
FIG. 6 is a perspective view illustrating a structure of a contact unit of a memory cell array in a semiconductor memory device according to an embodiment.
Figure 7:
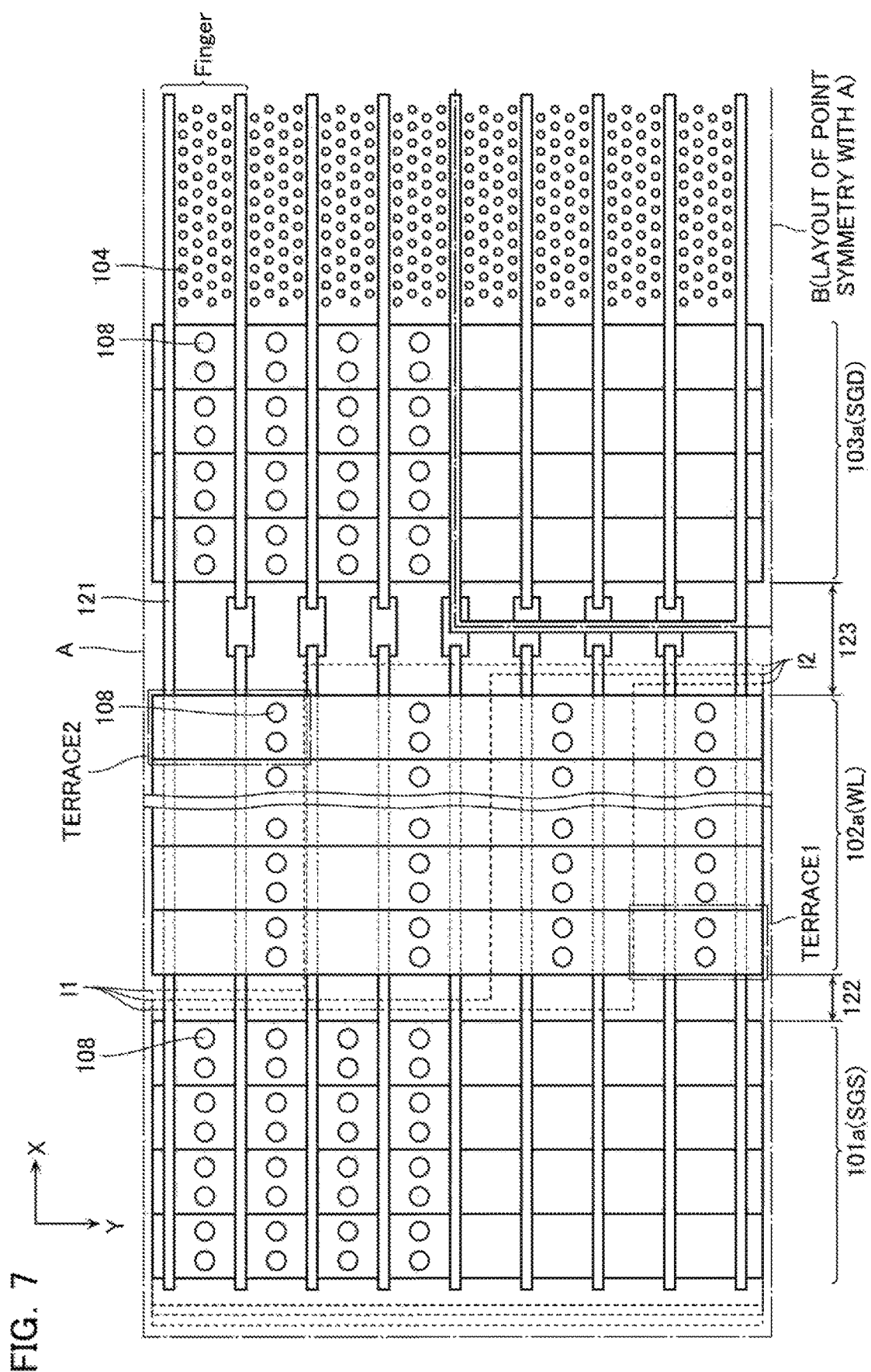
FIG. 7 is a plan view illustrating a layout of a contact unit of a memory cell array in a semiconductor memory device according to an embodiment.

FIG. 6 is a perspective view illustrating a structure of the contact unit of the memory cell array in the semiconductor memory device according to the embodiment. FIG. 7 is a plan view illustrating the layout of the contact unit of the memory cell array in the semiconductor memory device. In the cases of FIGS. 6 and 7, four fingers configure one memory block.

As described above, in the memory cell array 1 according to the embodiment, the plurality of conductive layers 101 to 103 are laminated from the lower layer to the upper layer. In FIGS. 6 and 7, the conductive layers 101 are 4 layers, the conductive layers 102 are 52 layers, and the conductive layers 103 are 4 layers. However, the embodiment is not limited thereto. Although not illustrated in the drawings, it should be noted that interlayer insulating films are inserted between the conductive layers 101 to 103 adjacent to each other in the Z direction for electrical insulation.

Similar to the first comparative example, ends of the contact units 101a and 103a of the conductive layers 101 and 103 becoming the selection gate lines SGS and SGD have stepwise structures extending in the X direction. In each of the conductive layers 101 and 103, one or more vias 108 (in the case of FIG. 7, two vias) are connected for each finger separated by grooves 121. The source contact LI is arranged in the groove 121.

Meanwhile, the ends of the contact units 102a of the conductive layers 102 becoming the word lines WL have stepwise structures extending in both directions of the X direction and the Y direction, similar to the second comparative example. That is, a terrace of each wiring line is arranged in a checkerboard pattern, when viewed from the Z direction. In addition, the plurality of vias 108 (in the case of FIG. 7, two vias) are connected to each terrace. A lower left terrace 1 in FIG. 7 corresponds to the contact unit 102a of the conductive layer 102 of a lowermost layer and an upper right terrace 2 in FIG. 7 corresponds to the contact unit 102a of the conductive layer 102 of an uppermost layer. Generally, when the ends of the contact units 102a of the conductive layers 102 are formed in shapes of N steps in the X direction, the contact unit 102a <n> of the n-th conductive layer 102 laminated from the lower side and the contact unit 102a <n+N> of the (n+N)-th conductive layer 102 laminated from the lower side correspond to terraces adjacent to each other in the Y direction.

In the cases of FIGS. 6 and 7, it should be noted that widths of the Y direction of the contact units 101a and 103a necessary for one memory block MB are substantially equal to a width of the Y direction of the memory block MB. Because a difference of steps of the Y direction formed in the ends of the contact units 102a is formed for every two fingers, a width of the Y direction of an arrangement area of the contact unit 102a necessary for one memory block MB is substantially two times larger than a width of the contact unit 101a or 103a. That is, it should be noted that the width of the Y direction of the arrangement area of the contact unit 102a necessary for one memory block MB is substantially equal to a width of the Y direction of an arrangement area of the two memory blocks MB arranged in the Y direction. However, FIGS. 6 and 7 are only exemplary and this embodiment is not limited thereto. As illustrated in FIG. 7, it should be noted that widths of the X direction of the terrace formed at the boundary of the conductive layers 101 and 102 and the terrace formed at the boundary of the conductive layers 102 and 103 are larger than widths of other terraces by widths 122 and 123, for simplification of a production process. As illustrated in FIG. 7, it should be noted that the memory cell array 1 has an area A and an area B having the layout of point symmetry with an area A.

As described above, in the case of the embodiment, the ends of the contact units 101a and 103a of the conductive layers 101 and 103 becoming the selection gate lines SGS and SGD are formed in the shapes of the steps extending in the X direction, so that the selection gate lines SGS and SGD can be selected for each finger, similar to the first comparative example. Thereby, load to the memory string MS at the time of the read operation and the write operation can be reduced as compared with the second comparative example. In addition, the ends of the contact units 102a of the conductive layers 102 becoming the word lines WL are formed in the shapes of the steps extending in both directions of the X direction and the Y direction, so that the width of the X direction of the contact area 107 can be decreased, as compared with the first comparative example.

Figure 8:
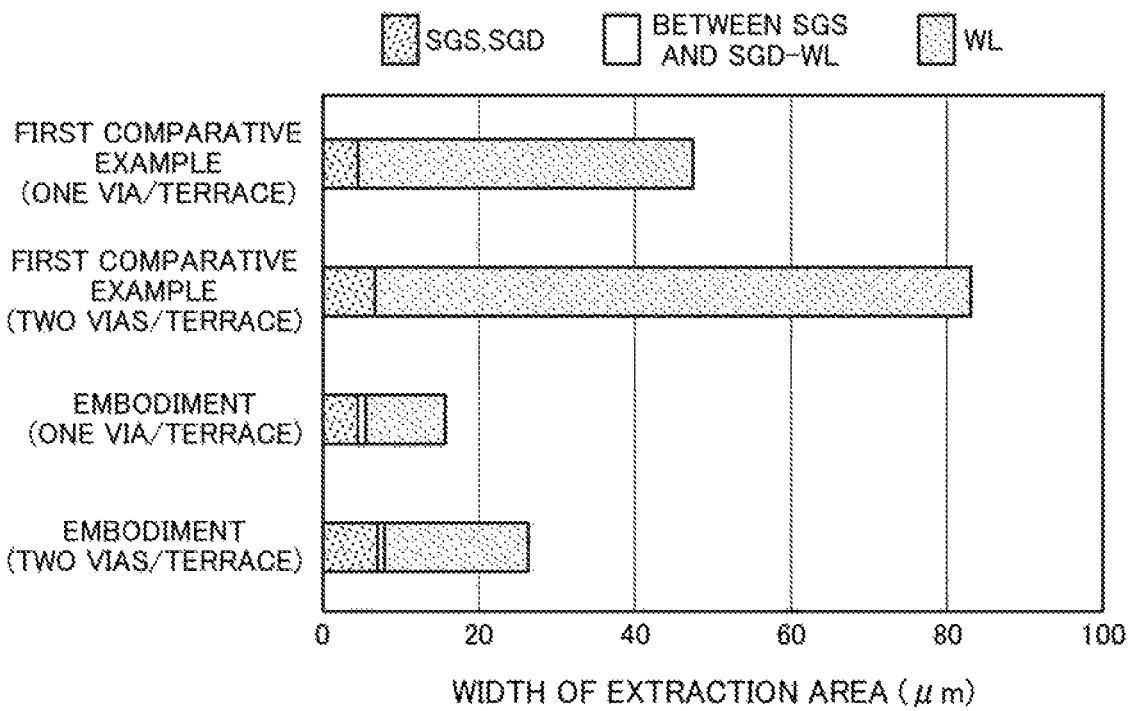
FIG. 8 is a graph illustrating widths of contact areas of memory cell arrays in semiconductor memory devices according to an embodiment and a comparative example.

FIG. 8 is a graph illustrating the widths of the contact areas of the memory cell arrays in the semiconductor memory devices according to the embodiment and the first comparative example. FIG. 8 illustrates an example of the case in which each of the conductive layers becoming the selection gate lines SGS and SGD is laminated by 4 layers and the conductive layers becoming the word lines WL are laminated by 52 layers.

As illustrated in FIG. 8, in the case of the embodiment, the widths of the X direction of the contact units 101a and 103a of the conductive layers 101 and 103 are equal to the widths in the first comparative example. Meanwhile, when the number of vias connected for each conductive layer (terrace) is the same, the width of the X direction of the contact unit 102a of the conductive layer 102 is greatly smaller than the width in the first comparative example, regardless of the number of vias. For this reason, in the case of the embodiment, the widths of the X direction are increased by the terraces (the widths 122 and 123 illustrated in FIG. 7) at the boundary of the source-side selection gate line SGS and the word line WL and the boundary of the drain-side selection gate line SGD and the word line WL. However, the widths of the X direction can be greatly decreased as compared with the first comparative example, when viewed from the entire contact area 107.

That is, according to the embodiment, a semiconductor memory device in which the chip size can be decreased as compared with the first comparative example and the load to the memory string MS at the time of the read operation and the write operation can be decreased as compared with the second comparative example can be provided.

Method of Producing Semiconductor Memory Device According to Embodiment

Next, a process for producing the contact units 101*a* to 103*a* of the memory cell array 1 according to the embodiment will be described.

FIGS. 9 to 30 are perspective views illustrating a process for producing the contact units of the memory cell array in the semiconductor memory device according to the embodiment.

First, transistors configuring a peripheral circuit are formed on a silicon substrate 131.

Figure 9:
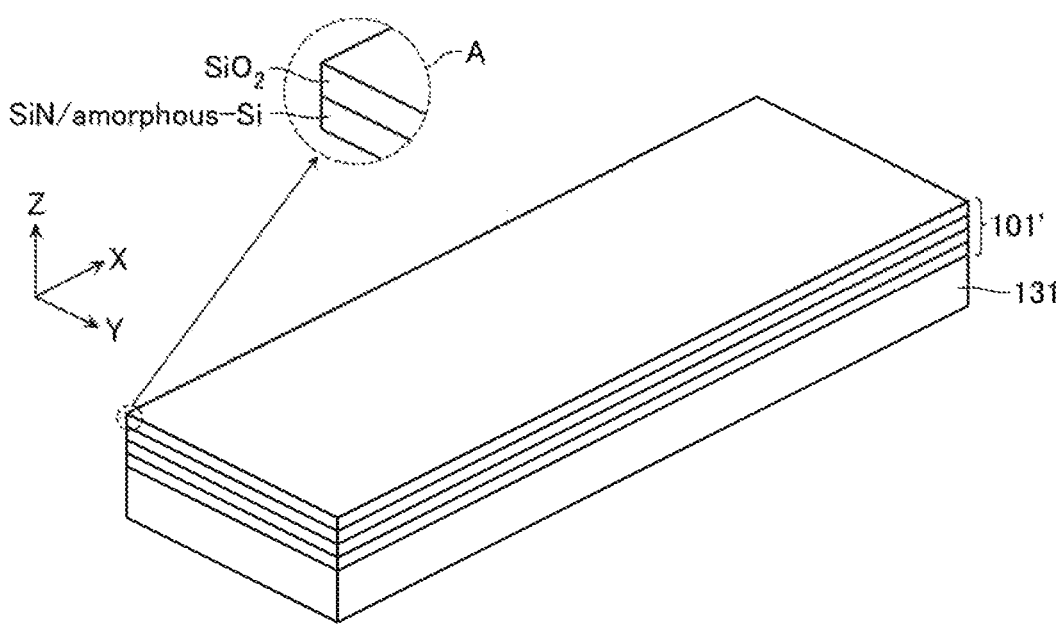
FIGS. 9 to 30 are perspective views illustrating a process for producing a contact unit of a memory cell array in a semiconductor memory device according to an embodiment.

Next, as illustrated in FIG. 9, laminates 101' (first laminates) are laminated on the silicon substrate 131 by an amount necessary for formation of the source-side selection gate line SGS. As illustrated by A of FIG. 9, each laminate 101' has a structure in which a silicon oxide film ($SiO_2$) and a silicon nitride film (SiN) or an amorphous silicon film (amorphous-Si) are laminated. That is, lamination of the plurality of laminates 101' is realized by laminating the silicon oxide film and the silicon nitride film or the amorphous silicon film alternately. An arrangement portion of the silicon nitride film or the amorphous silicon film becomes the source-side selection gate line SGS. Next, a photoresist having a pattern to form the groove 121 is formed on the laminate 101' using photolithography. Next, after the laminate 101' is etched using reactive ion etching (hereinafter, referred to as "RIE"), the photoresist is removed. Thereby, the groove 121 is formed in the laminate 101' and each finger is separated by the groove 121. Next, the silicon oxide film is formed on the laminate 101' and the silicon oxide film is buried in the groove 121. Next, the silicon oxide film of the uppermost layer formed is etched to have a desired film thickness using the RIE.

Figure 10:
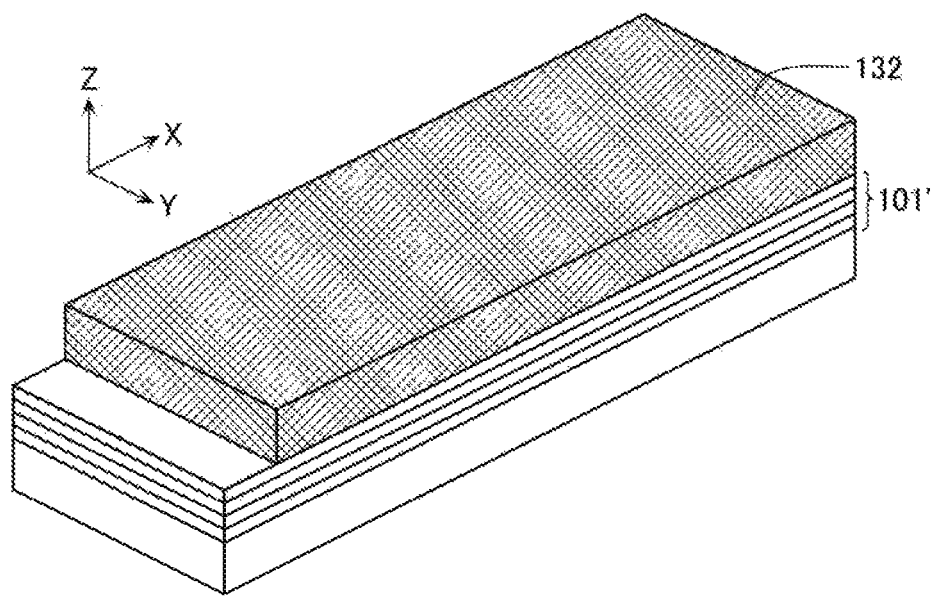

Next, as illustrated in FIG. 10, a photoresist 132 is laminated on the laminate 101' using the photolithography. The photoresist 132 has a pattern to form the terrace of the contact unit 101*a* of the conductive layer 101 of the lowermost layer.

Figure 11:
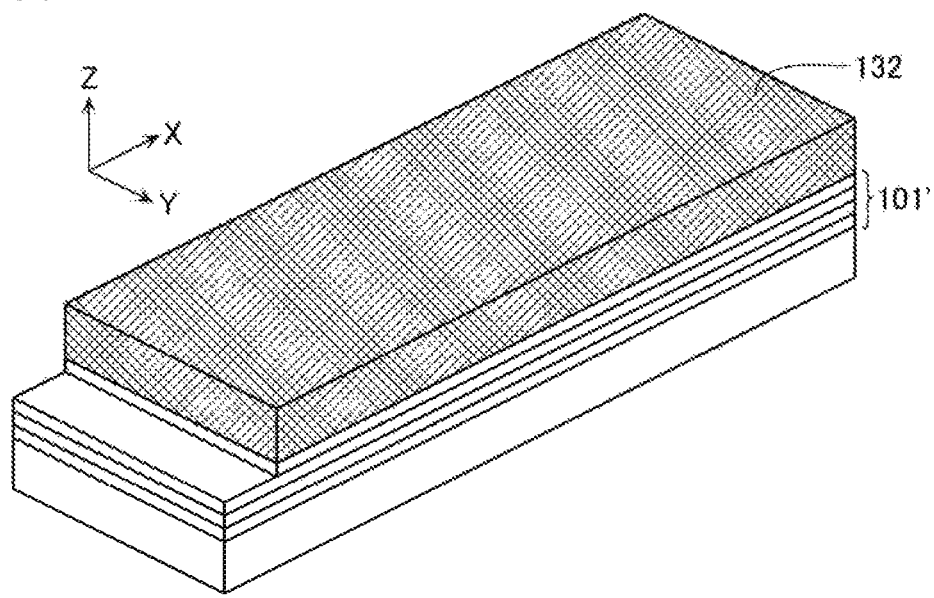

Next, as illustrated in FIG. 11, one laminate 101' is etched using the RIE.

Figure 12:
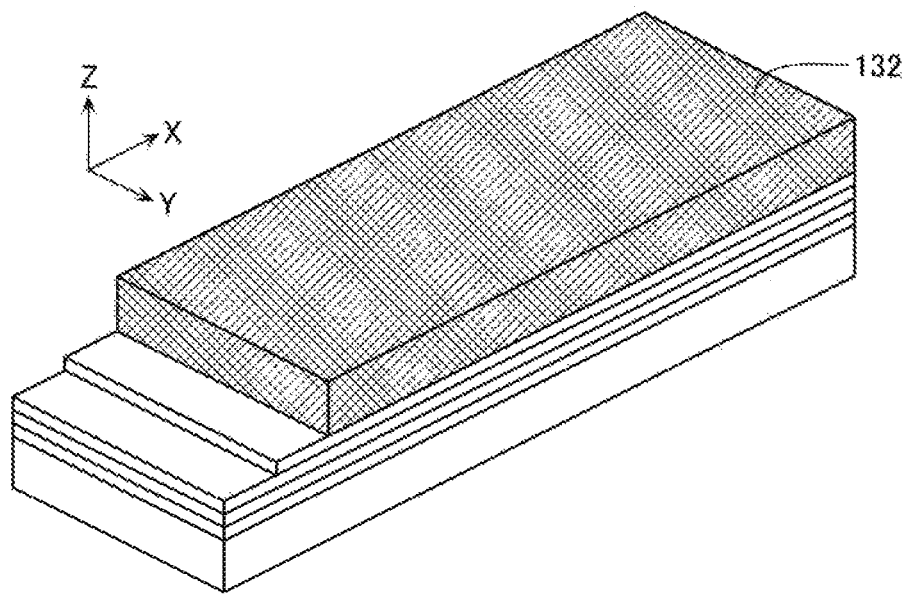

Next, as illustrated in FIG. 12, the photoresist 132 is slimmed in the X direction by one terrace of the contact unit 101*a*, using isotropic etching such as $O_2$ plasma treatment.

Figure 13:
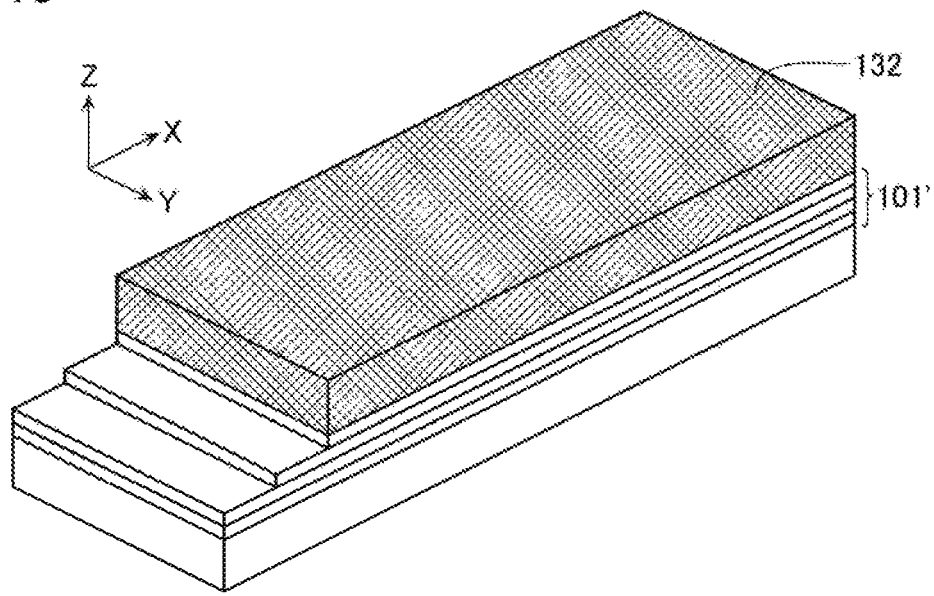

Next, as illustrated in FIG. 13, one laminate 101' is etched using the RIE. Thereby, an end of the laminate 101' is formed in a shape of a step extending in the X direction.

Figure 14:
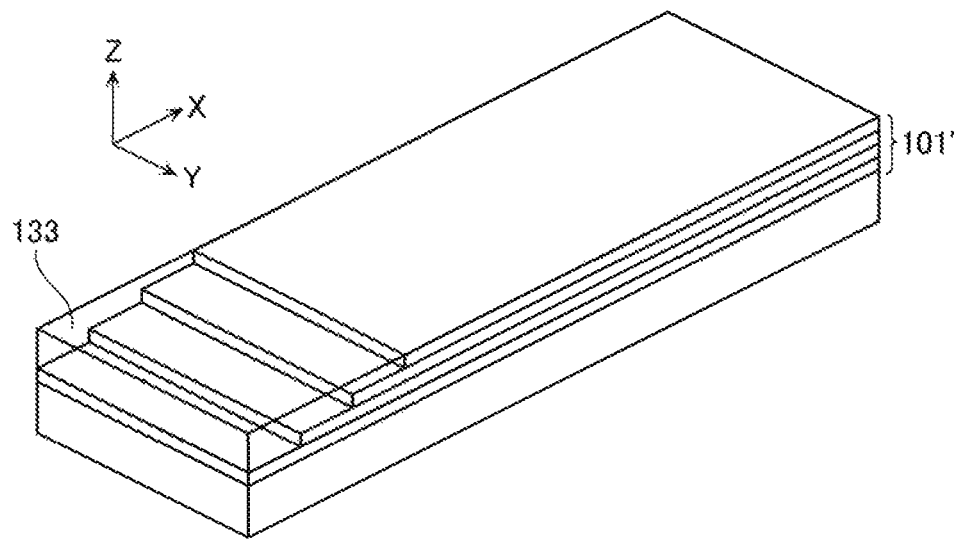

As such, slimming of the photoresist 132 illustrated in FIG. 12 and etching of the laminate 101' illustrated in FIG. 13 are repetitively executed in an allowable range of the film thickness of the photoresist 132. Thereby, as illustrated in FIG. 14, the end of the contact unit 101*a* having the stepwise structure extending in the X direction is formed. Next, after a silicon oxide film 133 is formed on the laminate 101', the silicon oxide film 133 is flattened using CMP.

Figure 15:
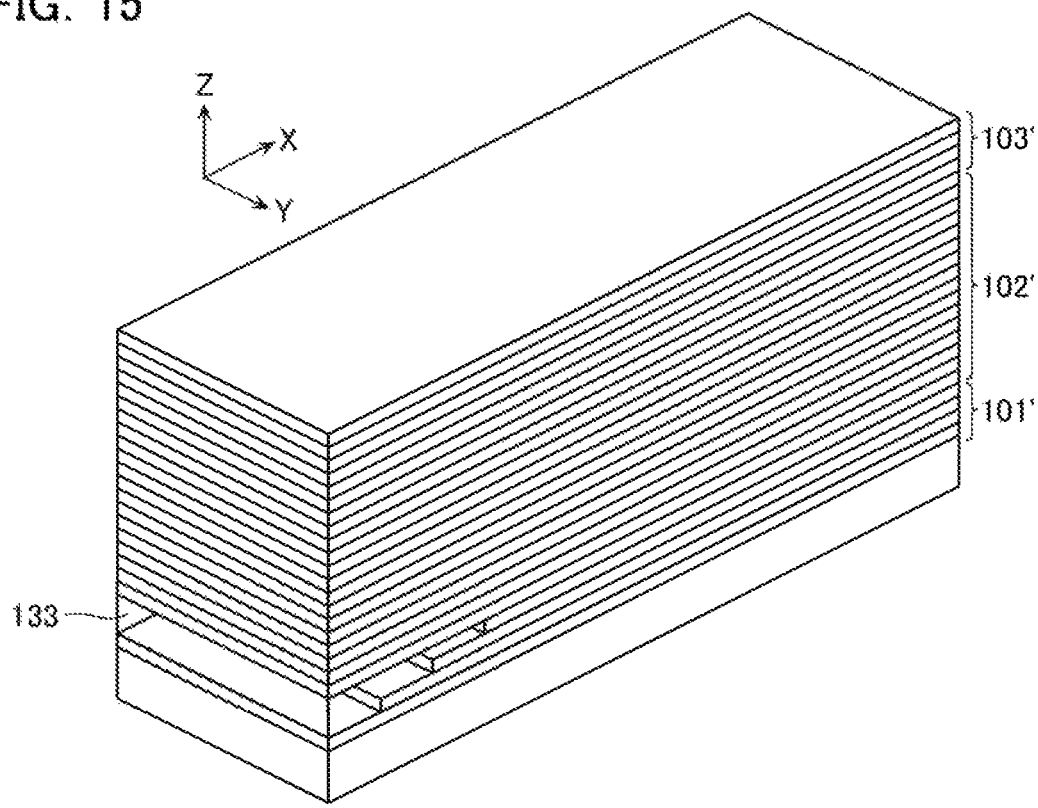

Next, as illustrated in FIG. 15, laminates 102' and 103' are laminated on the laminate 101' and the silicon oxide film 133 by an amount necessary for formation of the word line WL and the drain-side selection gate line SGD. Similar to the laminate 101', each of the laminates 102' and 103' has a structure in which the silicon oxide film and the silicon nitride film or the amorphous silicon film are laminated.

Figure 16:
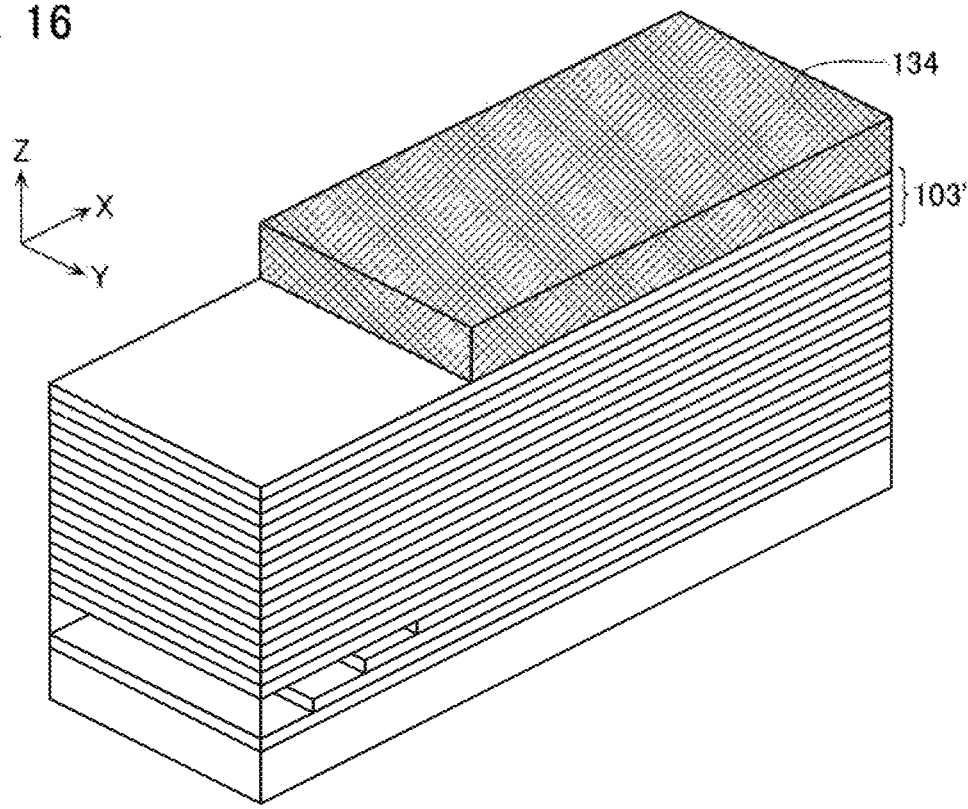

Next, as illustrated in FIG. 16, a photoresist 134 is laminated on the laminate 103' using the photolithography. The photoresist 134 has a pattern to form one terrace of the contact unit 102*a* of the conductive layer 102 in the X direction.

Figure 17:
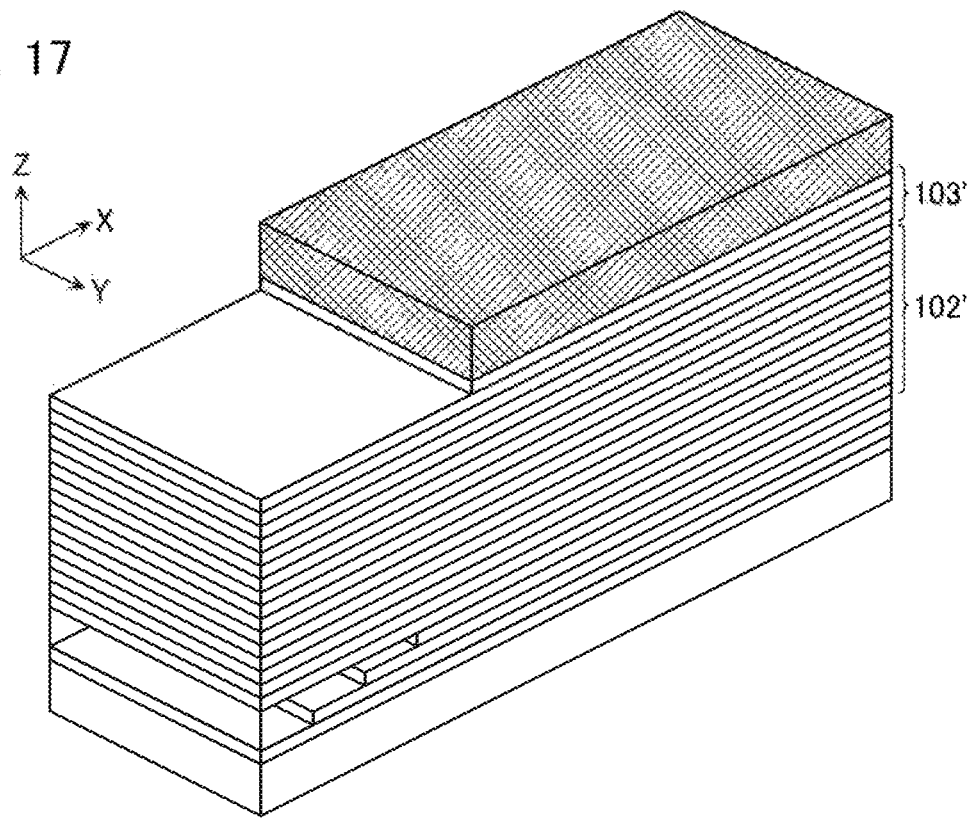

Next, as illustrated in FIG. 17, the laminates 102' and 103' are etched by one, using the RIE.

Figure 18:
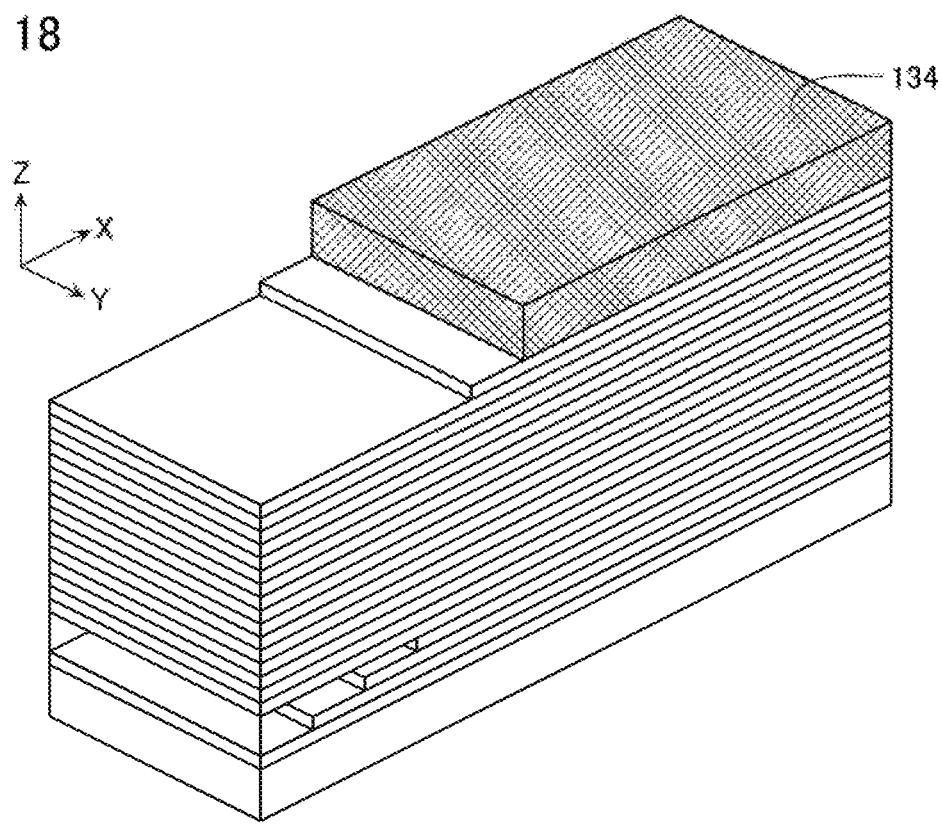

Next, as illustrated in FIG. 18, the photoresist 134 is slimmed in the X direction by one terrace of the contact unit 102*a*, using the isotropic etching such as the $O_2$ plasma treatment.

Figure 19:
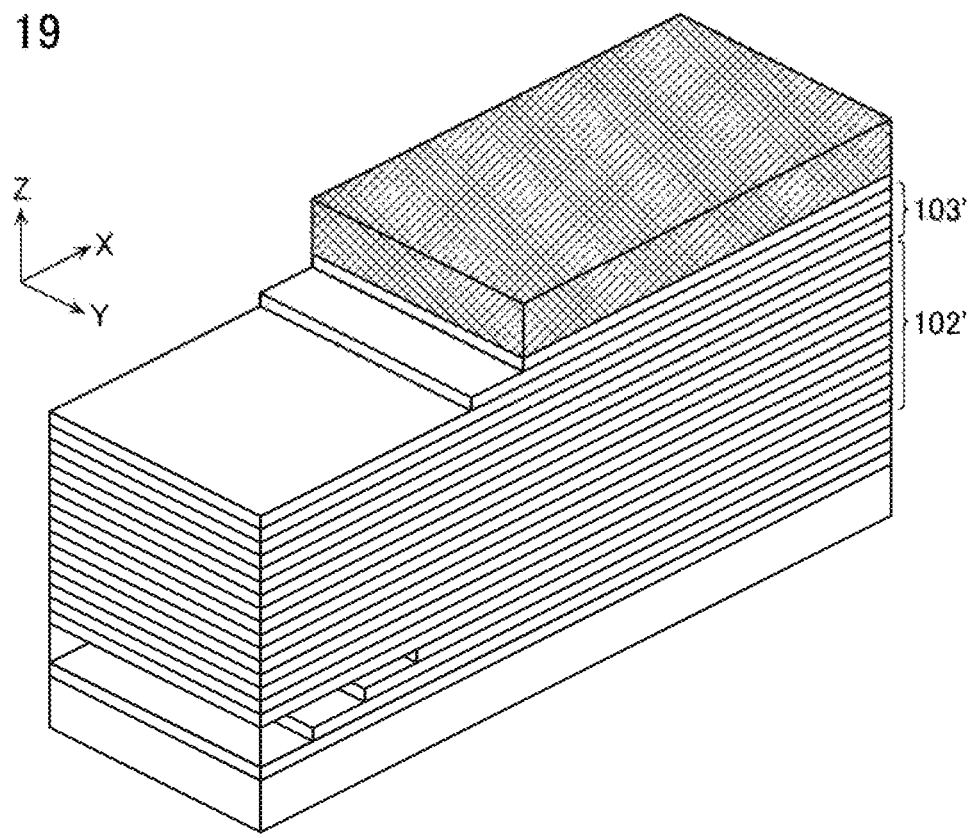

Next, as illustrated in FIG. 19, the laminates 102' and 103' are etched by one, using the RIE. Thereby, the ends of the laminates 102' and 103' are formed in shapes of steps extending in the X direction.

Figure 20:
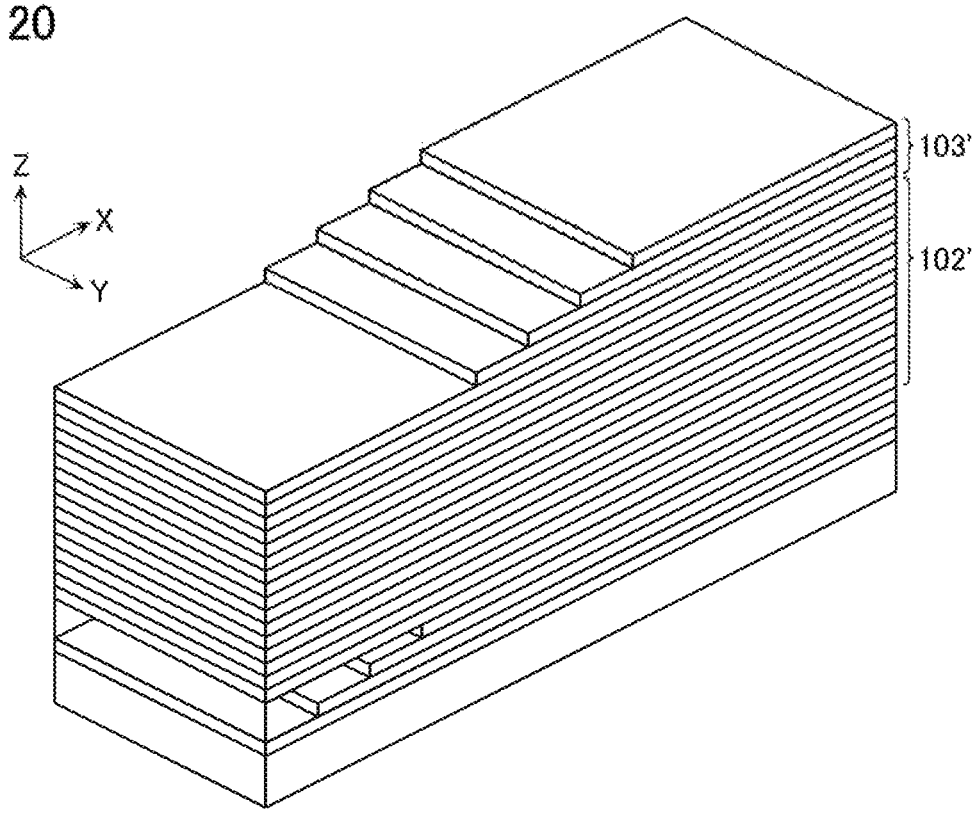

As such, slimming of the photoresist 134 illustrated in FIG. 18 and etching of the laminates 102' and 103' illustrated in FIG. 19 are repetitively executed in an allowable range of the film thickness of the photoresist 134. Thereby, as illustrated in FIG. 20, the ends of the laminates 102' and 103' are formed in the shapes of the steps extending in the X direction, in the arrangement area of the terrace of the contact unit 102*a*. Next, the photoresist 134 is removed.

Figure 21:
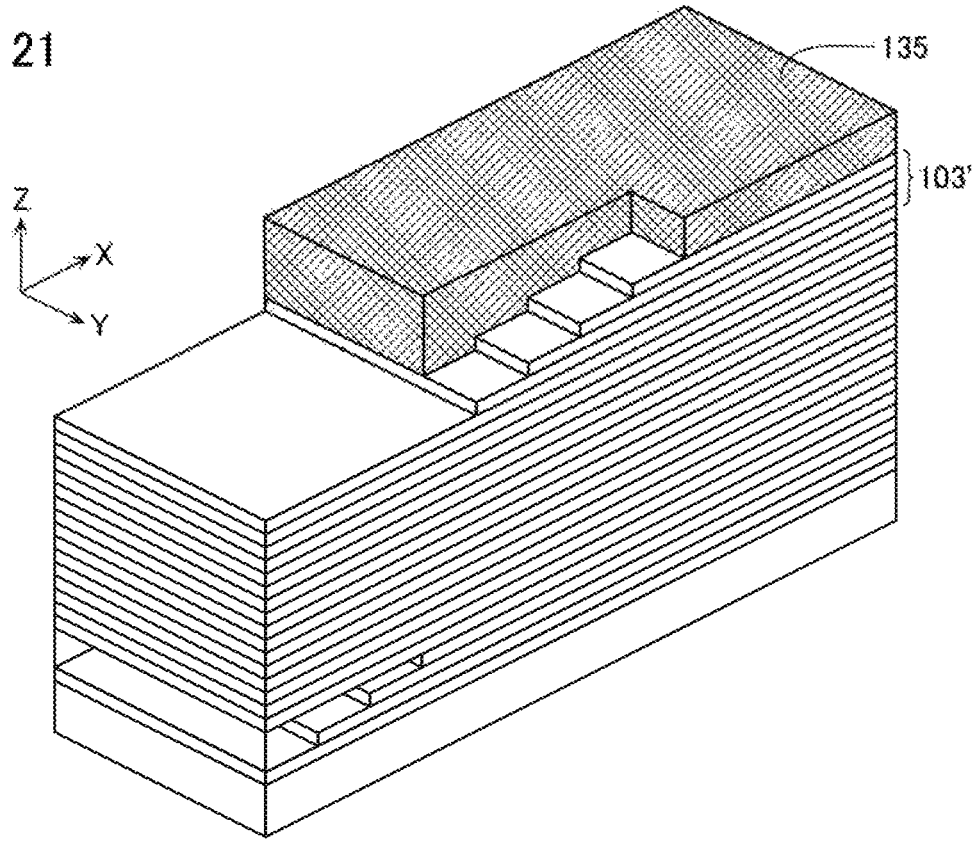

Next, as illustrated in FIG. 21, a photoresist 135 is laminated on the laminate 103' using the photolithography. The photoresist 135 has a pattern to form one terrace of the contact unit 102*a* of the conductive layer 102 in the Y direction.

Figure 22:
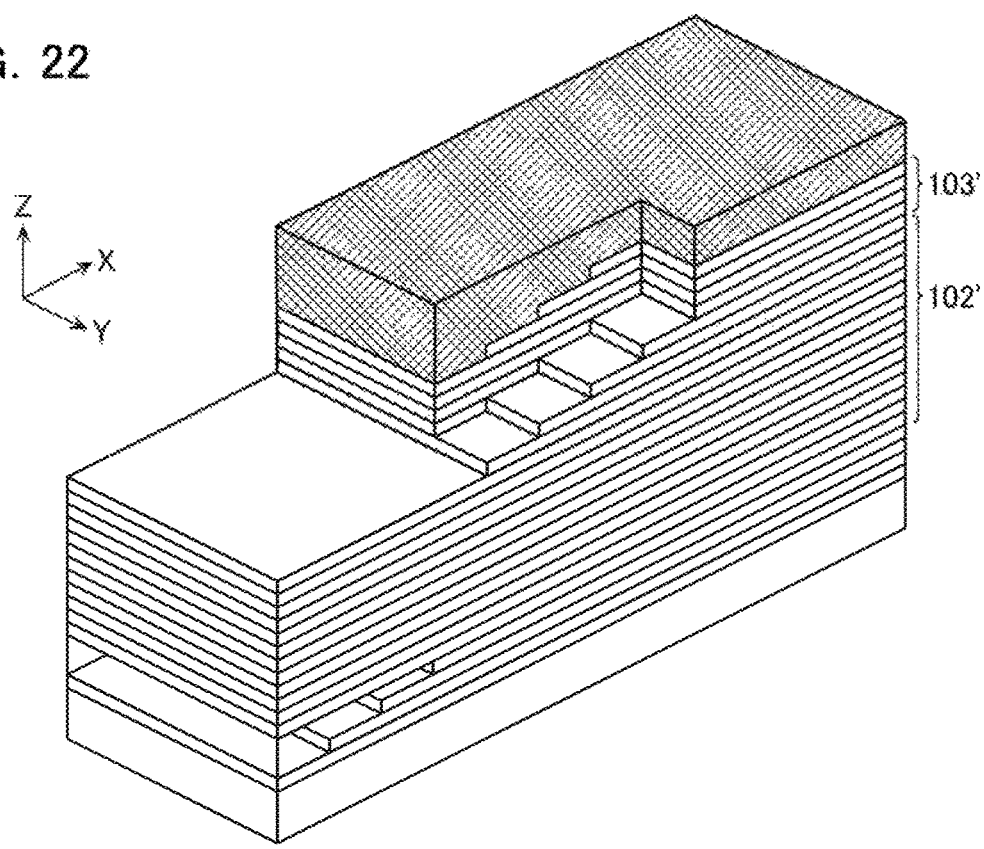

Next, as illustrated in FIG. 22, the laminates 102' and 103' are etched by the number of terraces (in the case of FIG. 22, the number corresponding to four layers) of the contact units 102*a* arranged in the X direction, using the RIE.

Figure 23:
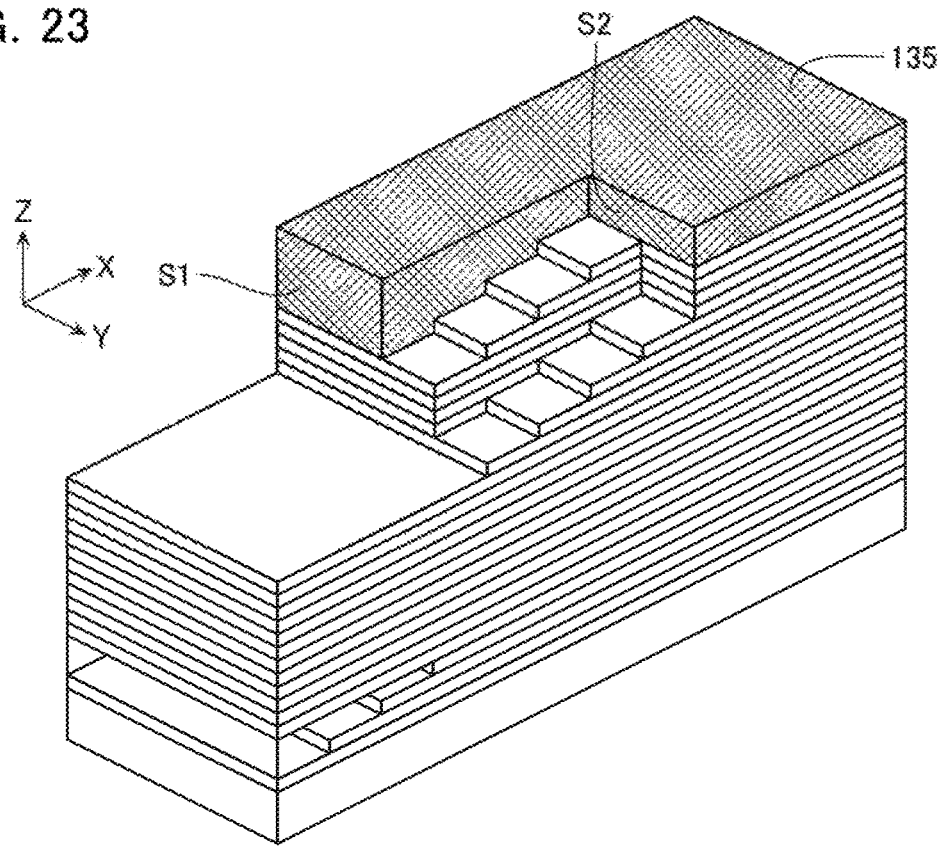

Next, as illustrated in FIG. 23, the photoresist 135 is slimmed in the Y direction by one terrace of the contact unit 102*a*, using the isotropic etching such as the $O_2$ plasma treatment.

Figure 24:
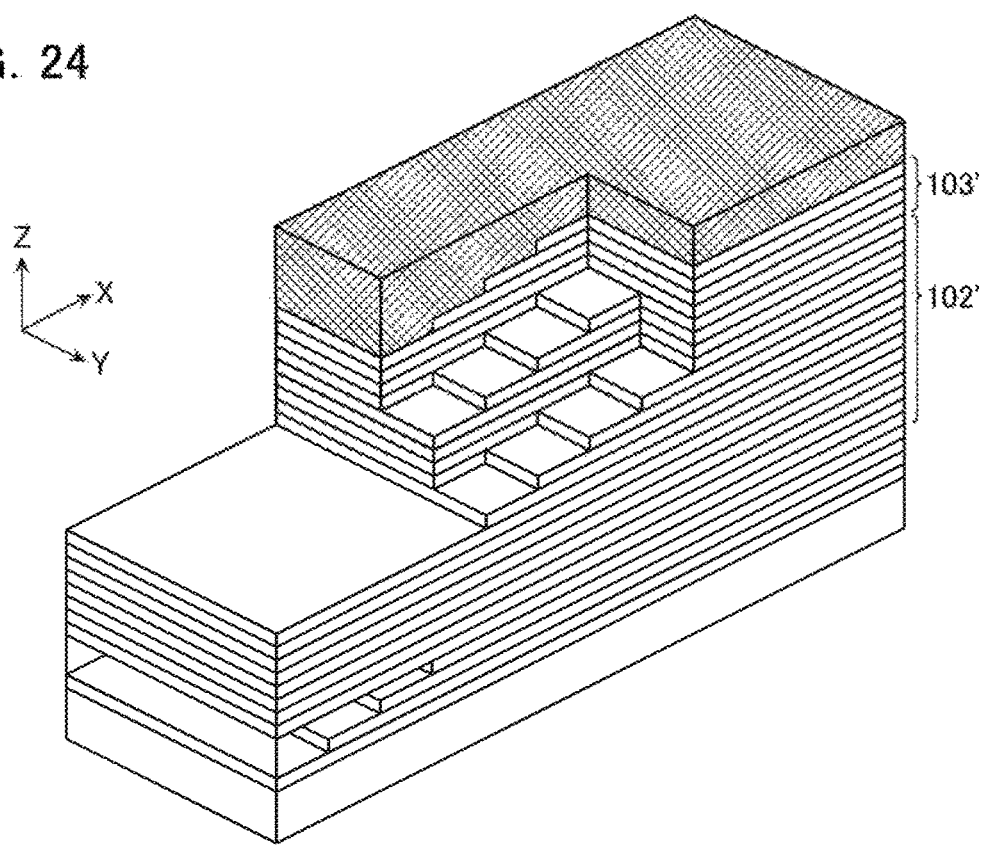

Next, as illustrated in FIG. 24, the laminates 102' and 103' are etched by the number of terraces (in the case of FIG. 24, the number corresponding to four layers) of the contact units 102*a* arranged in the X direction, using the RIE. Thereby, the ends of the laminates 102' and 103' are formed in shapes of steps extending in both directions of the X direction and the Y direction.

Figure 25:
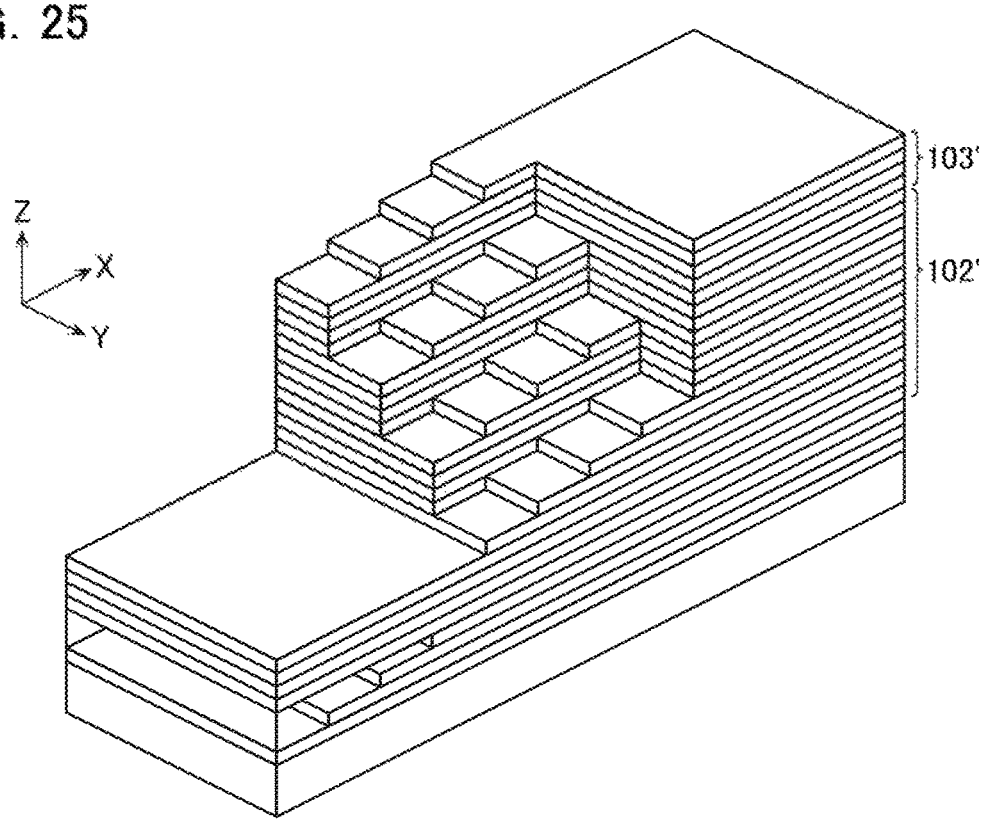

As such, slimming of the photoresist 135 illustrated in FIG. 23 and etching of the laminates 102' and 103' illustrated in FIG. 24 are repetitively executed in an allowable range of the film thickness of the photoresist 135. Thereby, as illustrated in FIG. 25, the ends of the laminates 102' and 103' are formed in the shapes of the steps extending in both directions of the X direction and the Y direction, in the arrangement area of the terrace of the contact unit 102*a*. Next, the photoresist 135 is removed.

In actuality, when the process illustrated in FIG. 23 is executed, in sides of the photoresist 135, a side S1 around the boundary of the arrangement areas of the terraces of the contact units 101*a* and 102*a* and a side S2 around the boundary of the arrangement areas of the terraces of the contact units 102*a* and 103*a* are also slimmed in the X direction. As a result, as illustrated by broken lines 11 and 12 of FIG. 7, a difference of steps is generated in the X direction around the boundaries. For this reason, it is necessary to increase the widths of the X direction of the terraces positioned around the boundaries as compared with other terraces.

Figure 26:
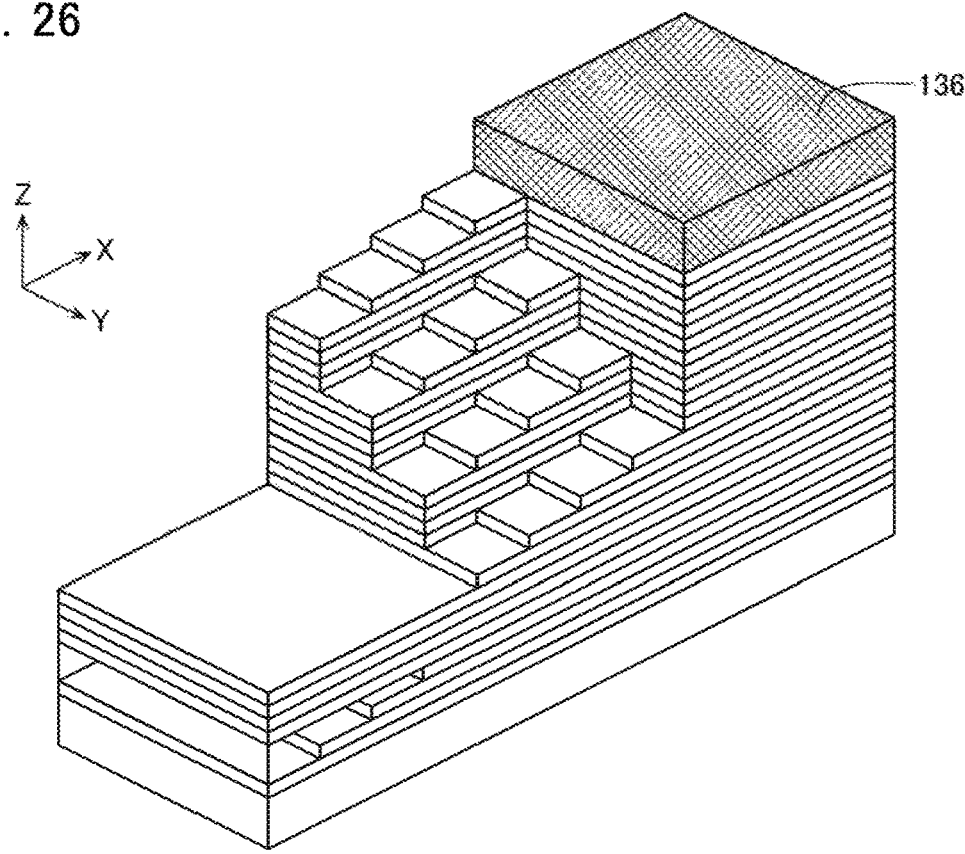

Next, as illustrated in FIG. 26, a photoresist 136 is laminated on the laminate 103' using the photolithography. The photoresist 136 has a pattern to cover the arrangement area of the terrace of the contact unit 103*a*.

Figure 27:
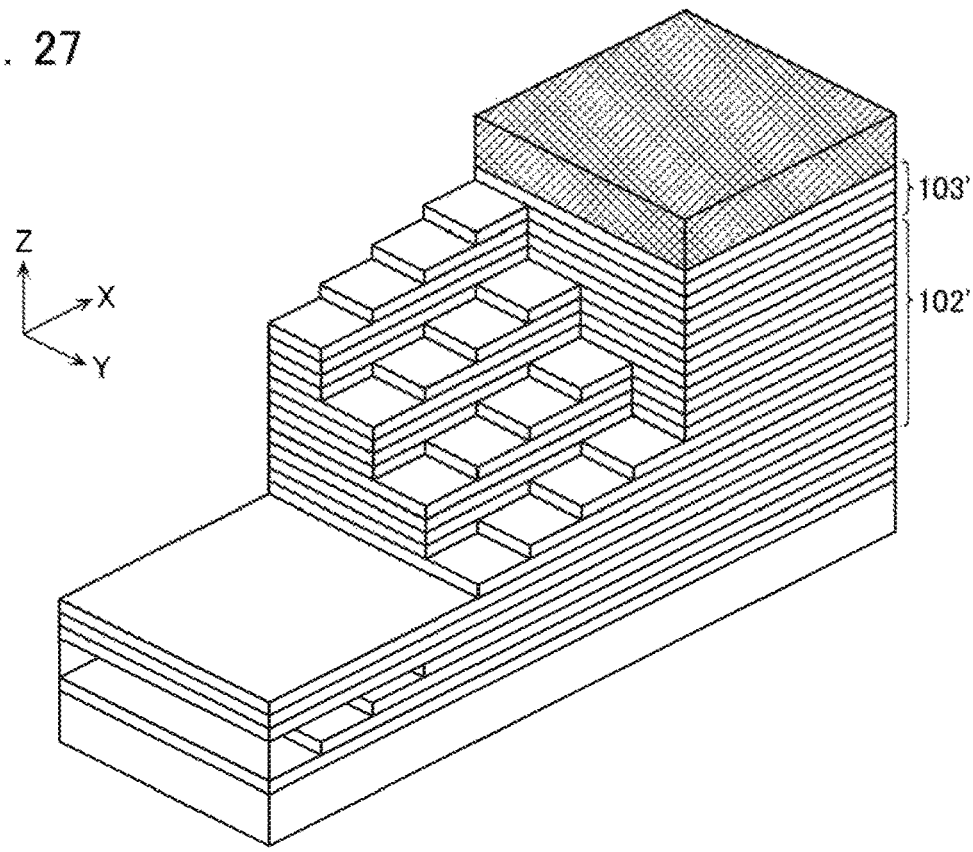

Next, as illustrated in FIG. 27, the laminates 102' and 103' are etched by one, using the RIE.

Figure 29:
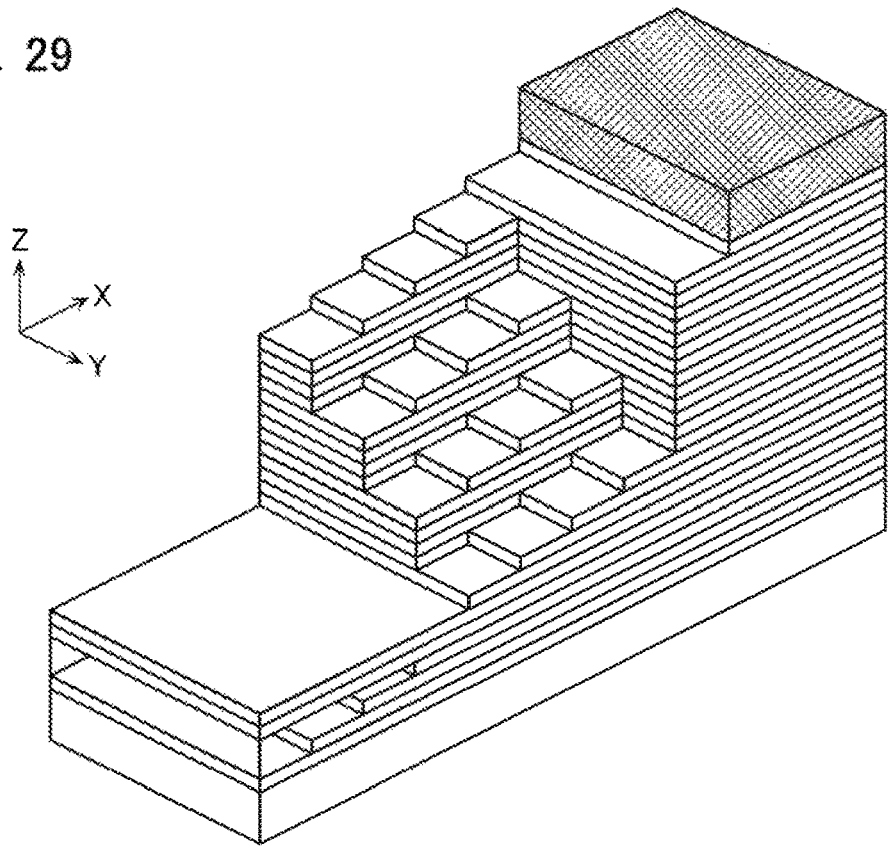

Next, as illustrated in FIG. 29, the photoresist 136 is slimmed in the X direction by one terrace of the contact unit 103*a*, using the isotropic etching such as the $O_2$ plasma treatment.

Next, as illustrated in FIG. 29, the laminates 102' and 103' are etched by one, using the RIE.

Figure 28:
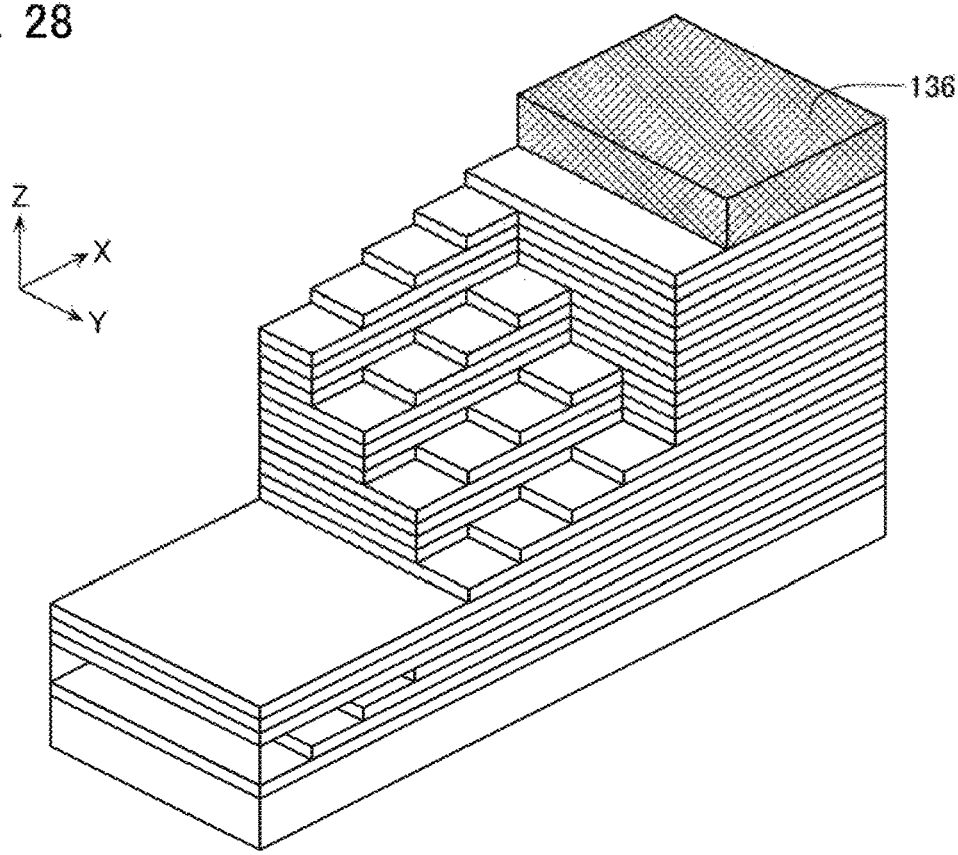
Figure 30:
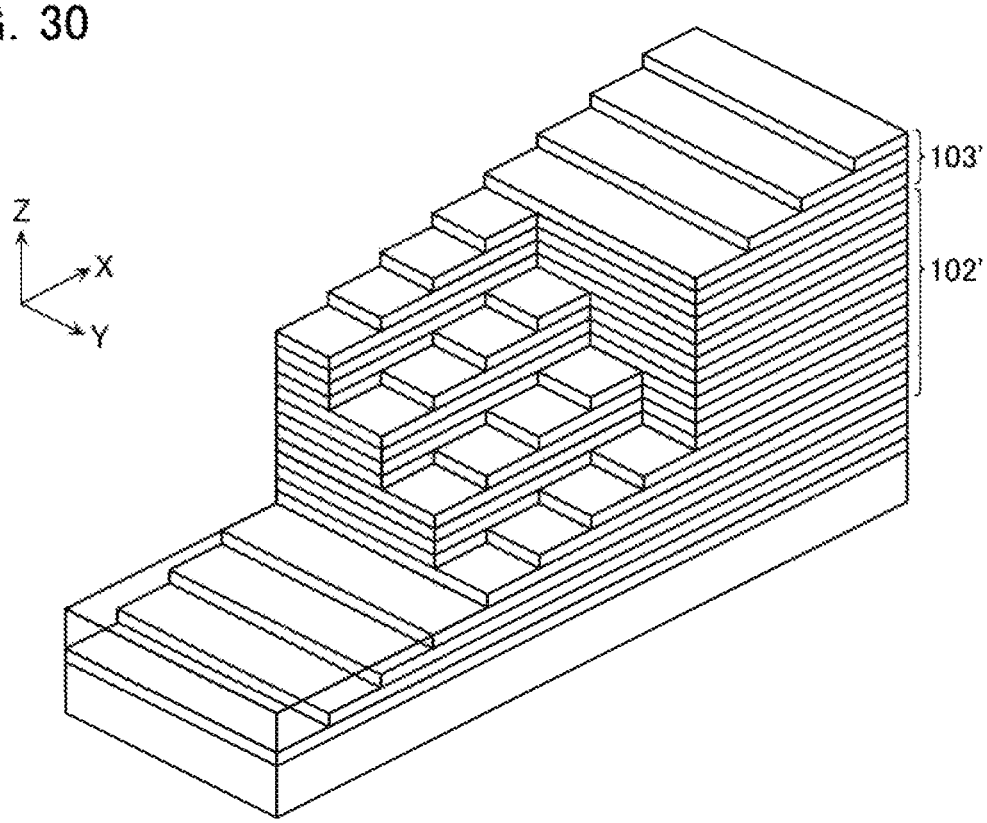

As such, slimming of the photoresist 136 illustrated in FIG. 28 and etching of the laminates 102' and 103' illustrated in FIG. 29 are repetitively executed in an allowable range of the film thickness of the photoresist 136. Thereby, as illustrated in FIG. 30, the end of the contact unit 102*a* having the stepwise structure extending in both directions of the X direction and the Y direction and the end of the contact unit 103*a* having the stepwise structure extending in the X direction are formed.

Next, after the silicon oxide film is formed on an interlayer insulating film 133 and the laminates 102' and 103', the silicon oxide film is flattened using the CMP. Next, formation of the memory transistor MT for the memory area 106 and formation of the via 108 for the contact area 107 are executed.

As such, the process for producing the contact units 101*a* to 103*a* is executed.

Next, another process for producing the contact units 101*a* to 103*a* of the memory cell array 1 according to the embodiment will be described.

FIGS. 31 to 51 are perspective views illustrating another process for producing the contact unit of the memory cell array in the semiconductor memory device according to the embodiment.

First, transistors configuring a peripheral circuit are formed on the silicon substrate 131.

Figure 31:
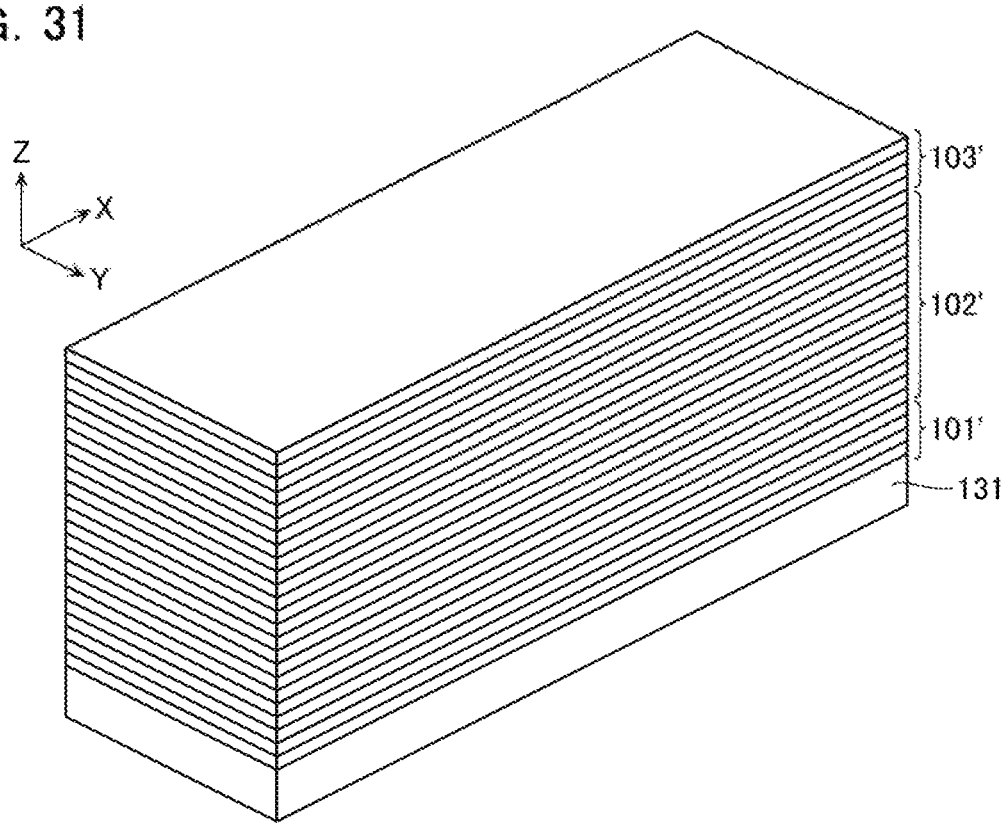
FIGS. 31 to 51 are perspective views illustrating another process for producing a contact unit of a memory cell array in a semiconductor memory device according to an embodiment.

Next, as illustrated in FIG. 31, laminates 101' (first laminates), 102' (second laminates), and 103' (third laminates) are laminated on the silicon substrate 131 by an amount necessary for formation of the source-side selection gate line SGS, the word line WL, and the drain-side selection gate line SGD. Similar to A of FIG. 9, each of the laminates 101' to 103' has a structure in which a silicon oxide film and a silicon nitride film or an amorphous silicon film are laminated.

Figure 32:
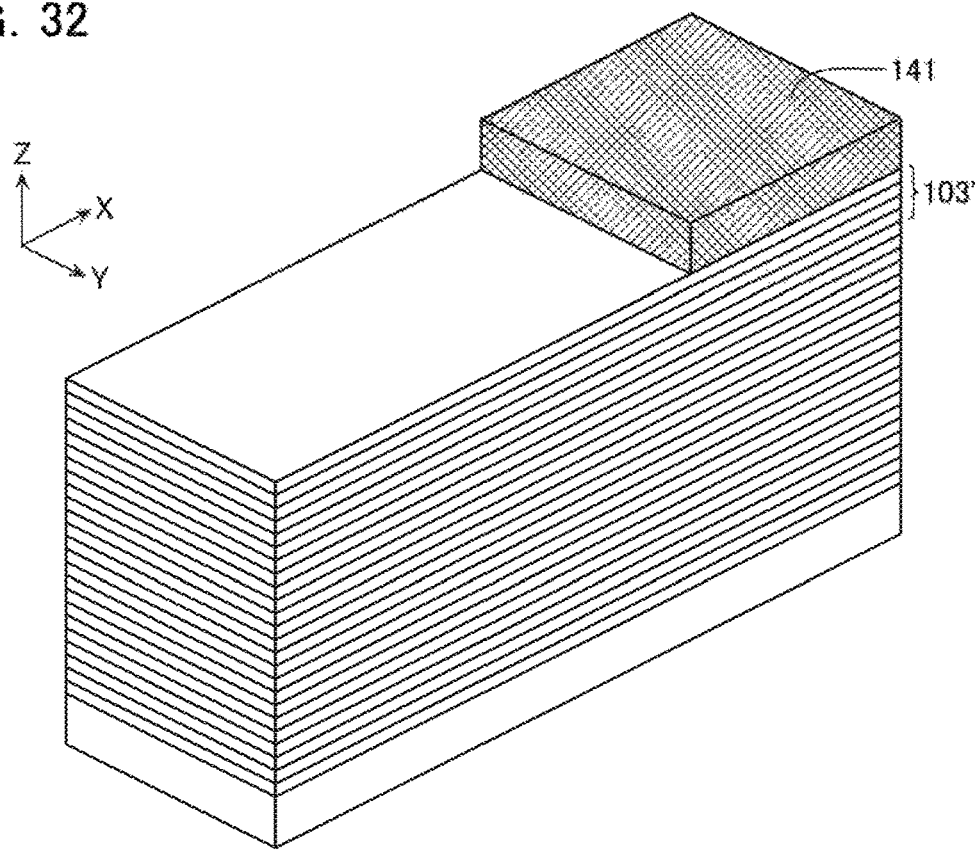

Next, as illustrated in FIG. 32, a photoresist 141 is laminated on the laminate 103' using the photolithography. The photoresist 141 has a pattern to cover an arrangement area of the terrace of the contact unit 103*a*.

Figure 33:
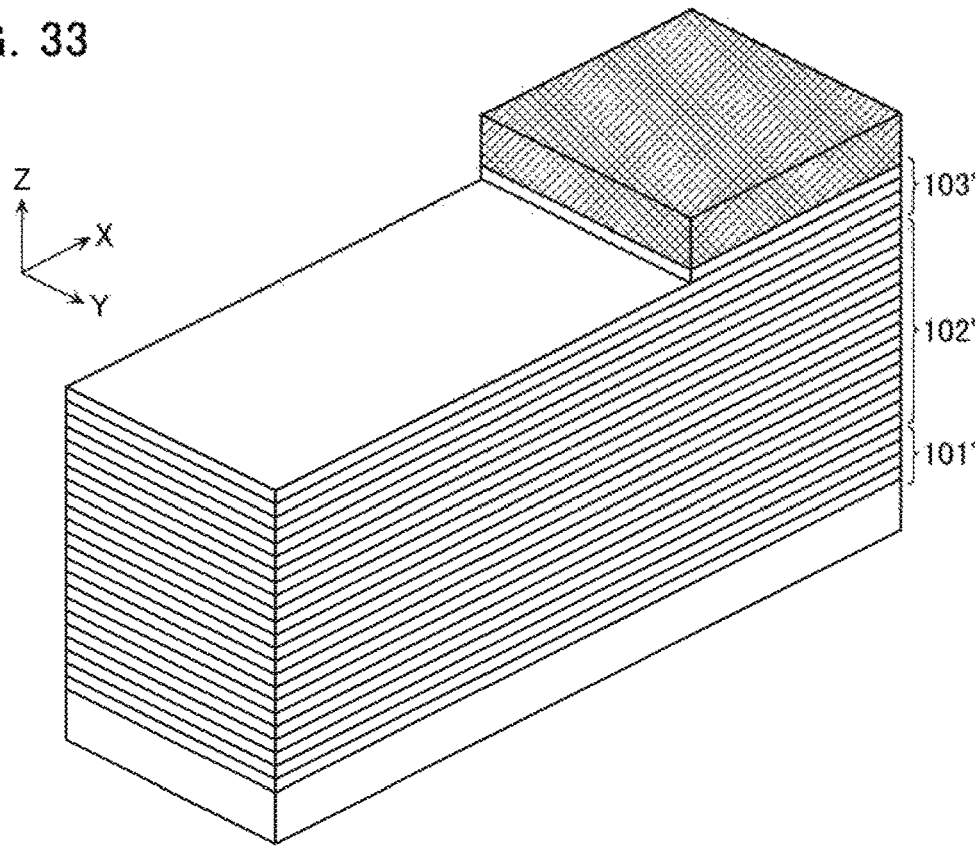

Next, as illustrated in FIG. 33, the laminates 101' to 103' are etched by one, using the RIE.

Figure 34:
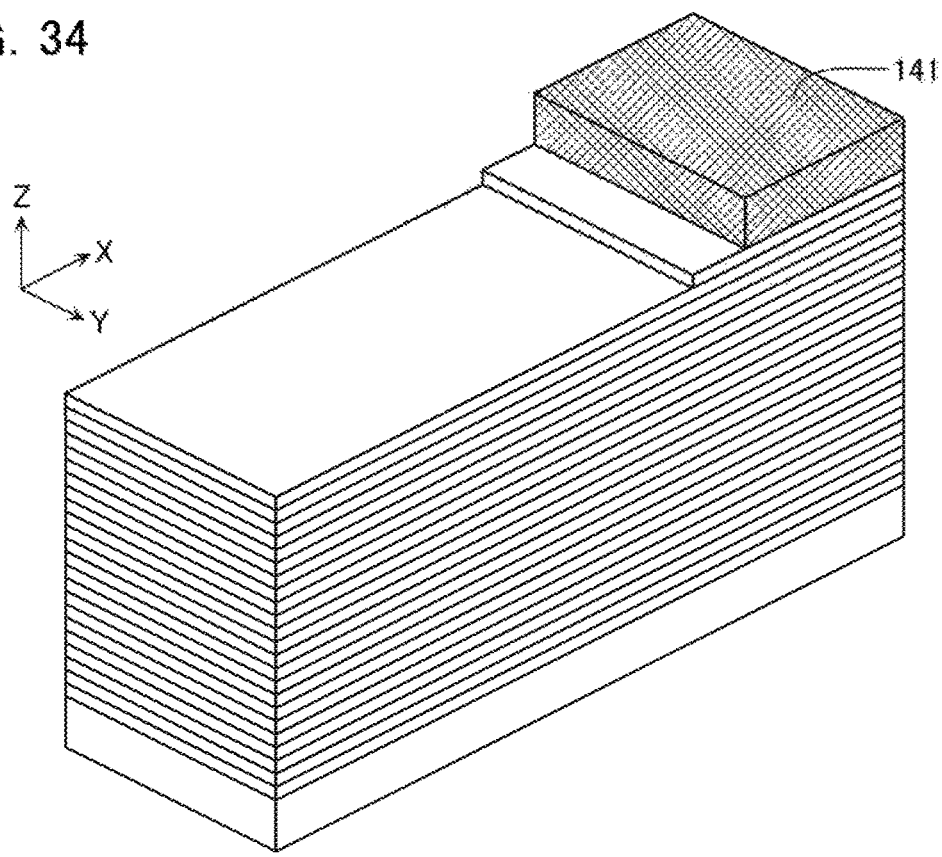

Next, as illustrated in FIG. 34, the photoresist 141 is slimmed in the X direction by one terrace of the contact unit 103*a*, using the isotropic etching such as the $O_2$ plasma treatment.

Figure 35:
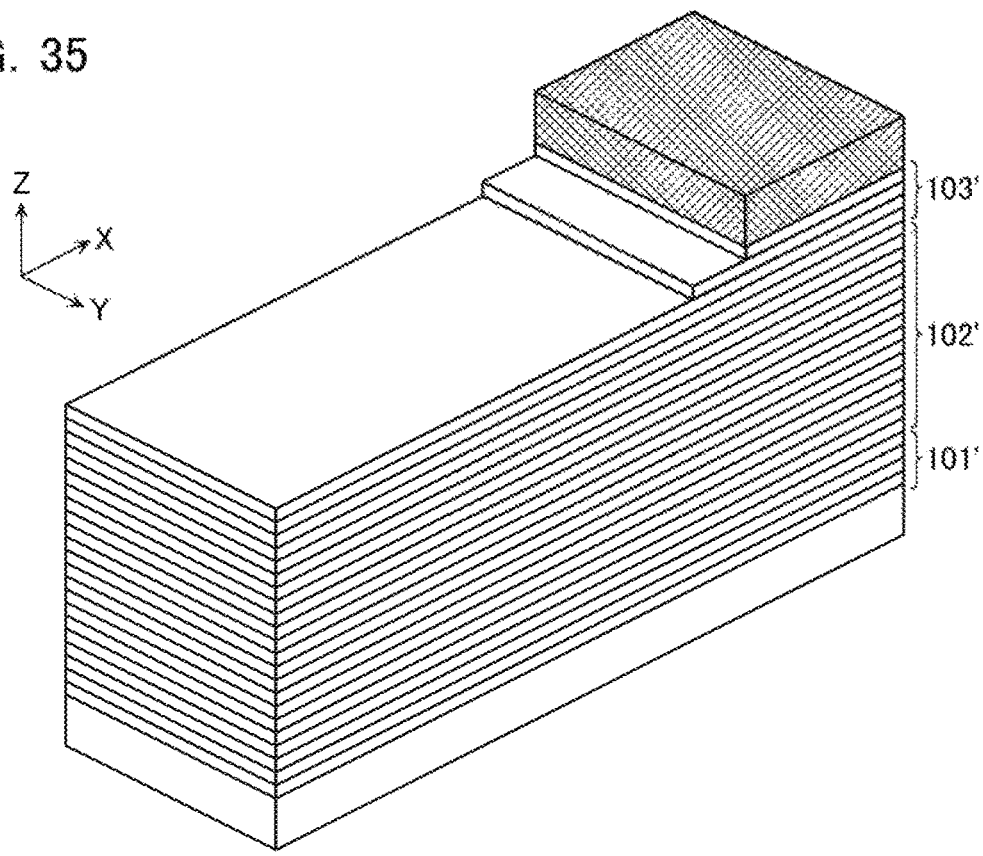

Next, as illustrated in FIG. 35, the laminates 101' to 103' are etched by one, using the RIE. Thereby, the ends of the laminates 101' to 103' are formed in shapes of steps extending in the X direction.

As such, slimming of the photoresist 141 illustrated in FIG. 34 and etching of the laminates 101' to 103' illustrated in FIG. 35 are repetitively executed in an allowable range of the film thickness of the photoresist 141. Thereby, as illustrated in FIG. 36, the end of the contact unit 103*a* having the stepwise structure extending in the X direction is formed.

Figure 36:
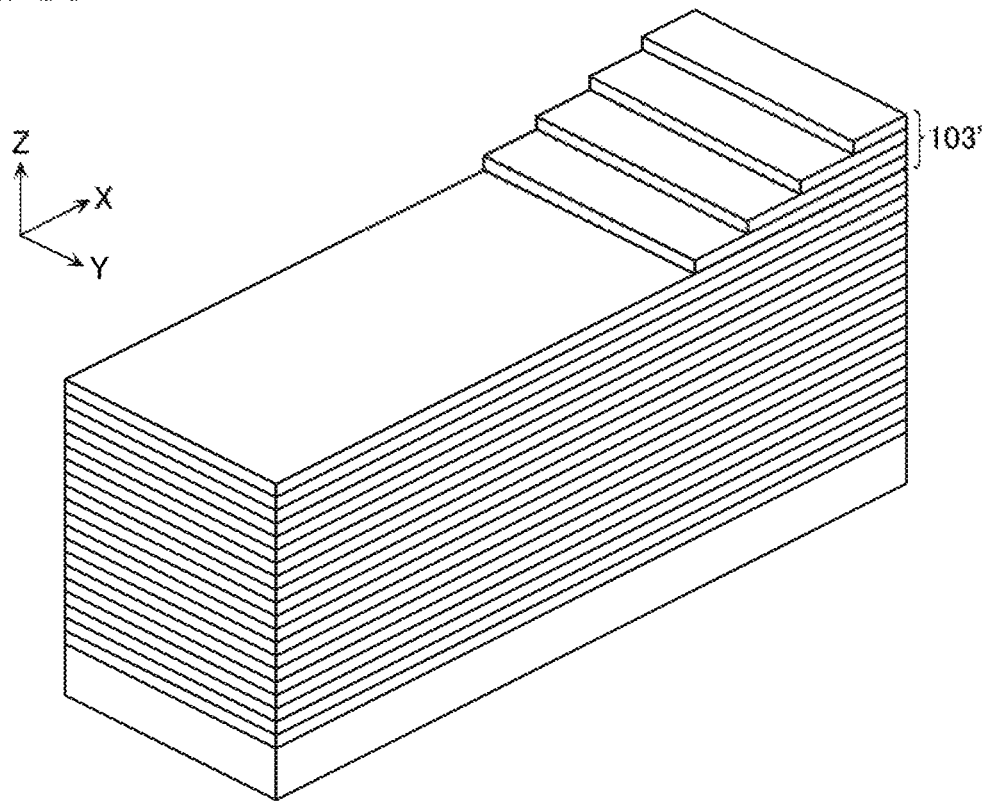

Thereby, as illustrated in FIG. 36, the ends of the laminates 101' to 103' are formed in shapes of steps extending in the X direction, in the arrangement area of the terrace of the contact unit 103*a*.

Figure 37:
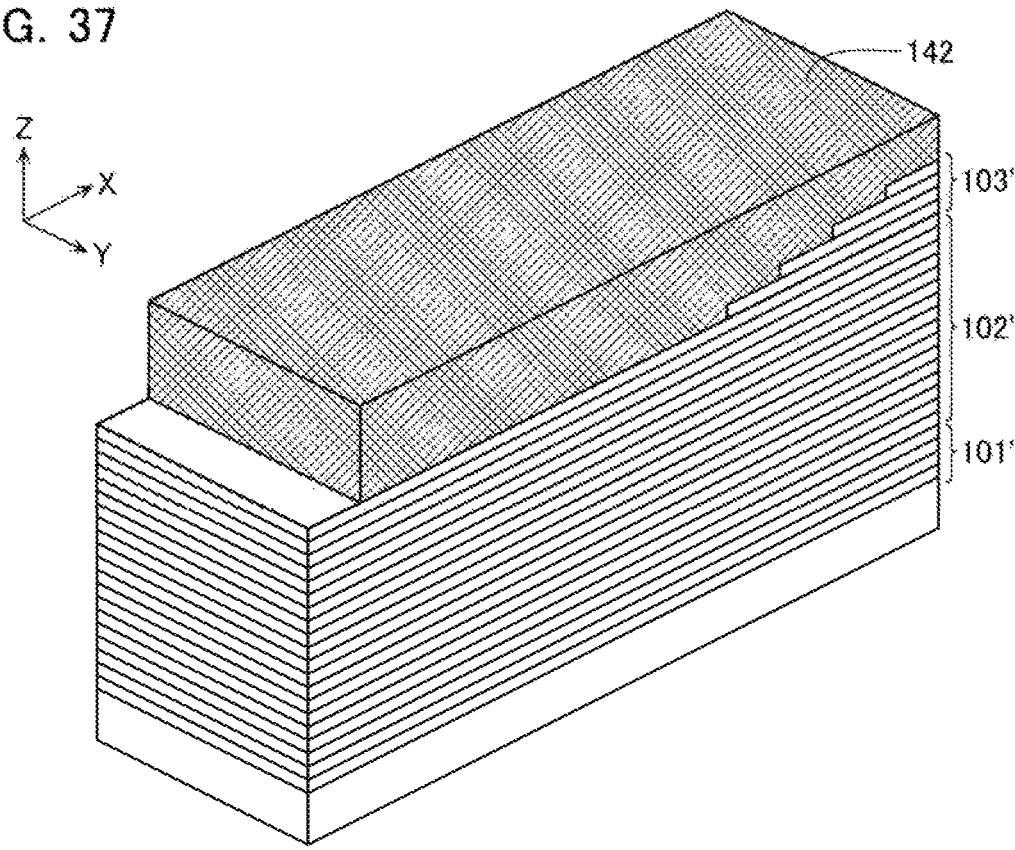

Next, as illustrated in FIG. 37, a photoresist 142 is laminated on the laminates 102' and 103' using the photolithography. The photoresist 142 has a pattern to form the terrace of the contact unit 101*a* of the conductive layer 101 of the lowest layer.

Figure 38:
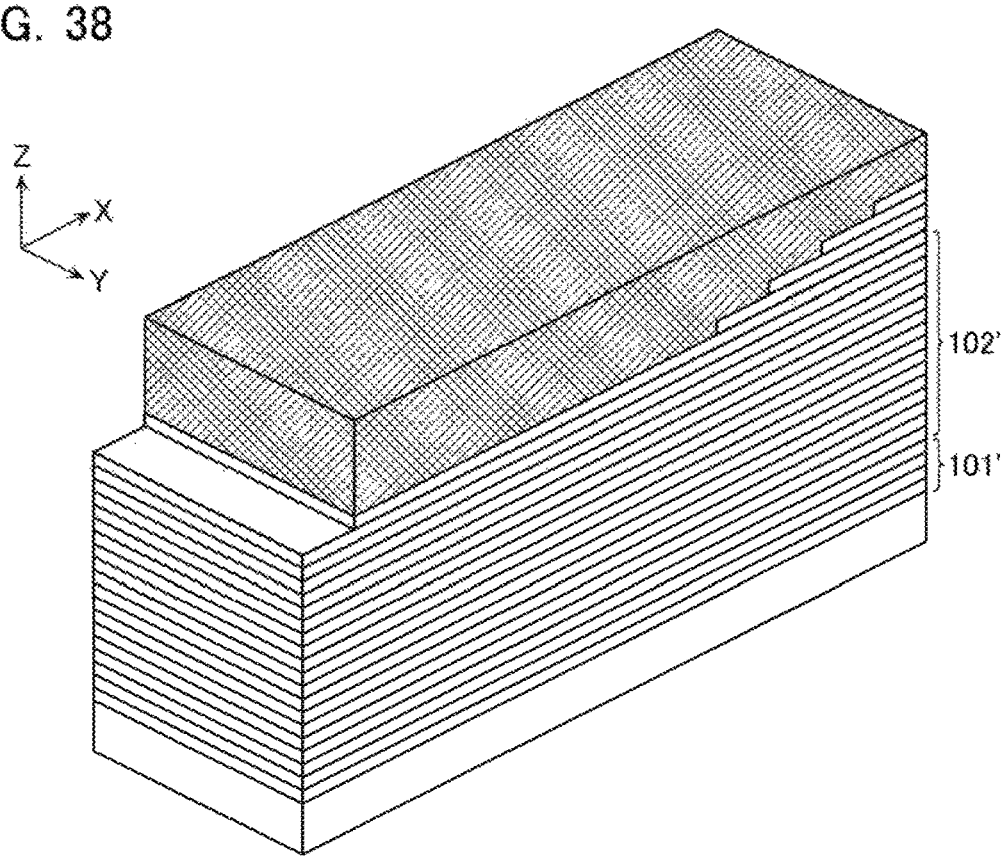

Next, as illustrated in FIG. 38, the laminates 101' and 102' are etched by one, using the RIE.

Figure 39:
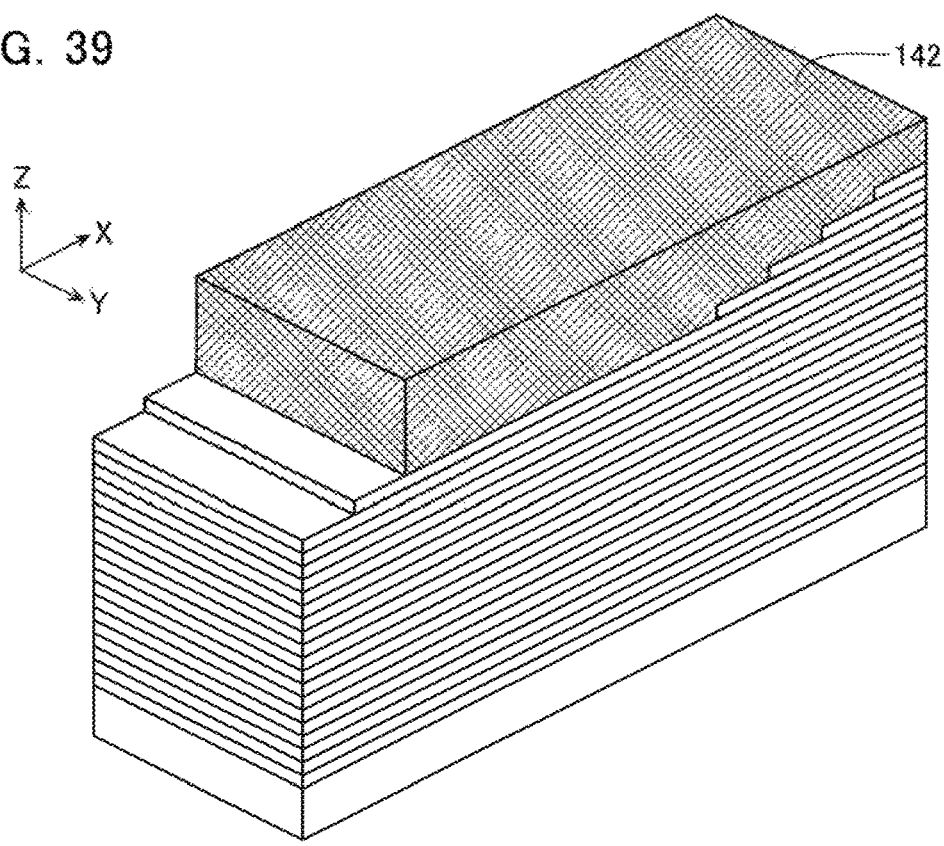

Next, as illustrated in FIG. 39, the photoresist 142 is slimmed in the X direction by one terrace of the contact unit 101*a*, using the isotropic etching such as the $O_2$ plasma treatment.

Figure 40:
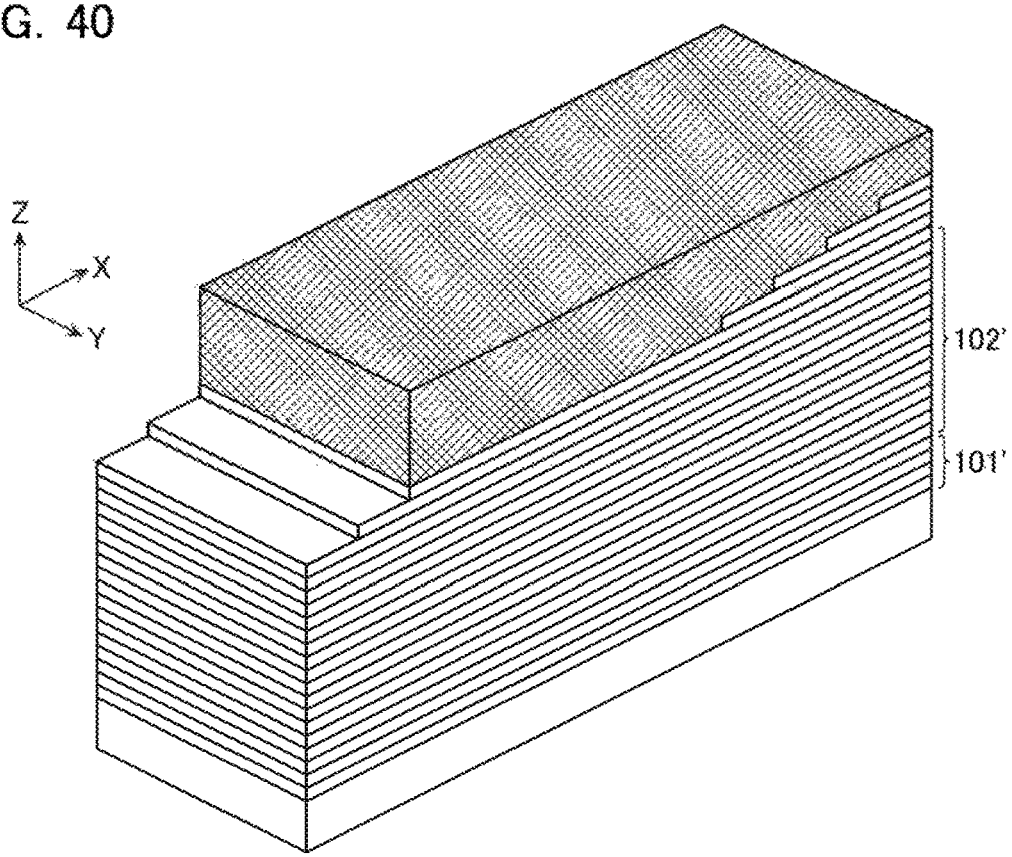

Next, as illustrated in FIG. 40, the laminates 101' and 102' are etched by one, using the RIE. Thereby, the ends of one laminates 101' and 102' are formed in shapes of steps extending in the X direction.

Figure 41:
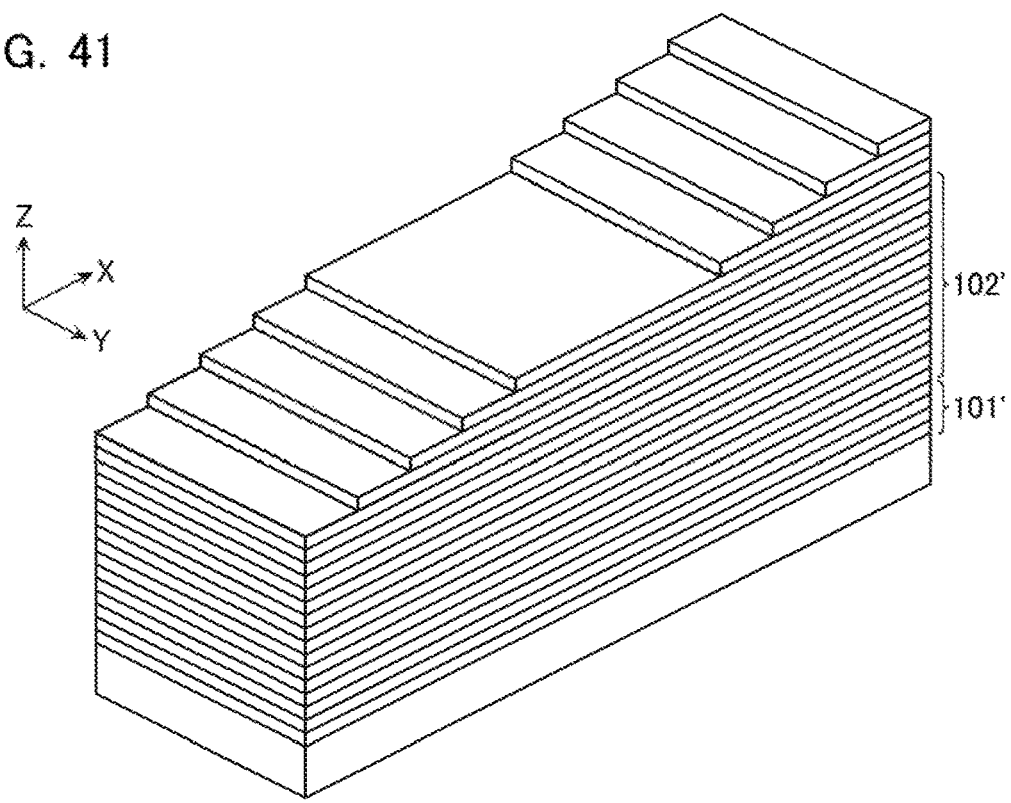

As such, slimming of the photoresist 142 illustrated in FIG. 39 and etching of the laminates 101' and 102' illustrated in FIG. 40 are repetitively executed in an allowable range of the film thickness of the photoresist 142. Thereby, as illustrated in FIG. 41, the ends of the laminates 101' and 102' are formed in the shapes of the steps extending in the X direction, in the arrangement area of the terrace of the contact unit 101*a*. Next, the photoresist 142 is removed.

Figure 42:
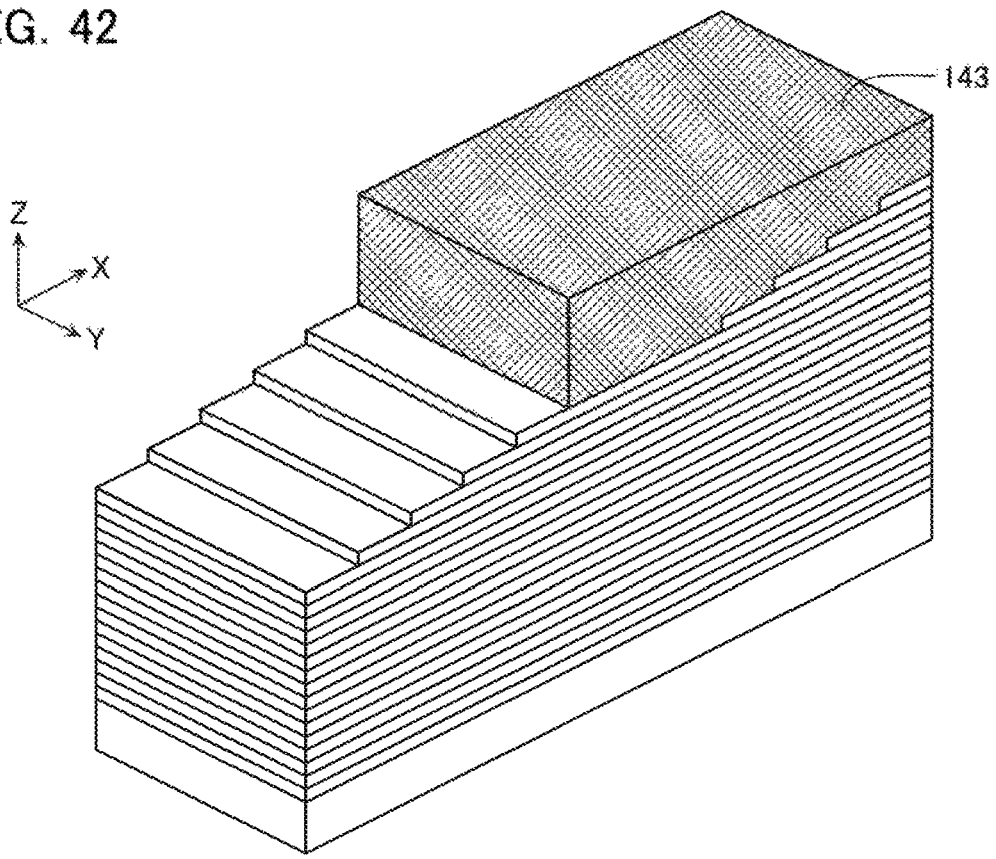

Next, as illustrated in FIG. 42, a photoresist 143 is laminated on the laminates 102' and 103' using the photolithography. The photoresist 143 has a pattern to form one terrace of the contact unit 102*a* of the conductive layer 102 in the X direction.

Figure 43:
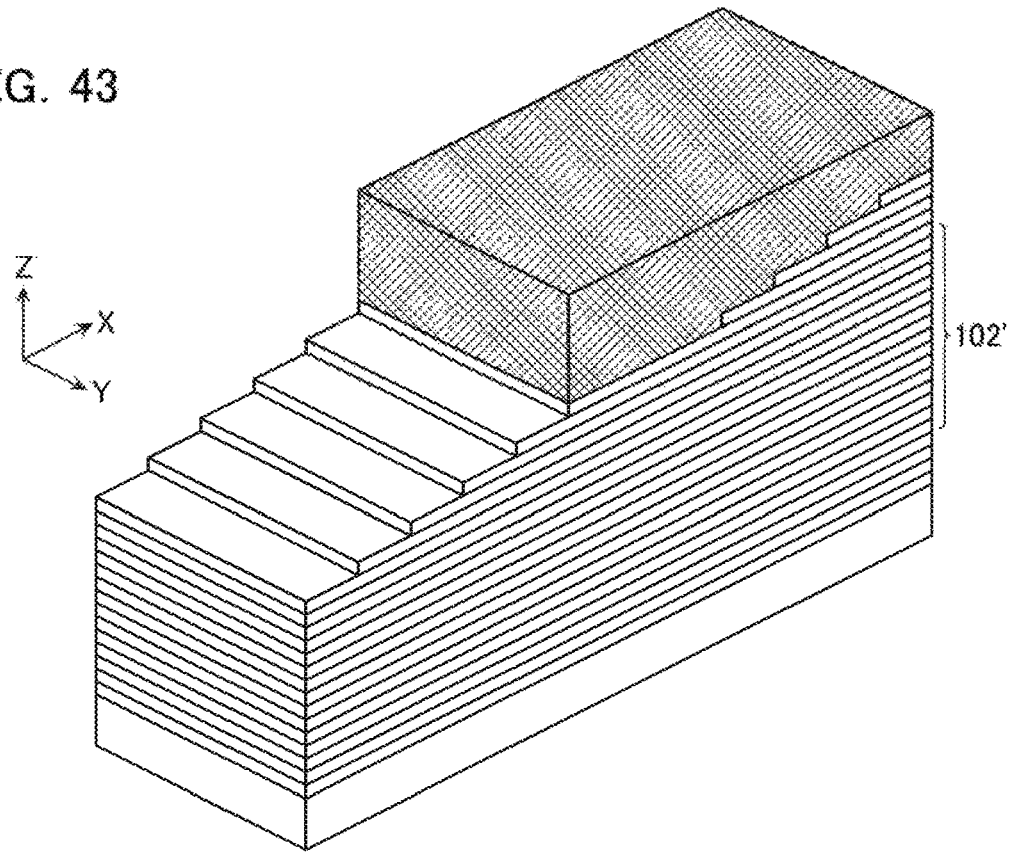

Next, as illustrated in FIG. 43, one laminate 102' is etched using the RIE.

Figure 44:
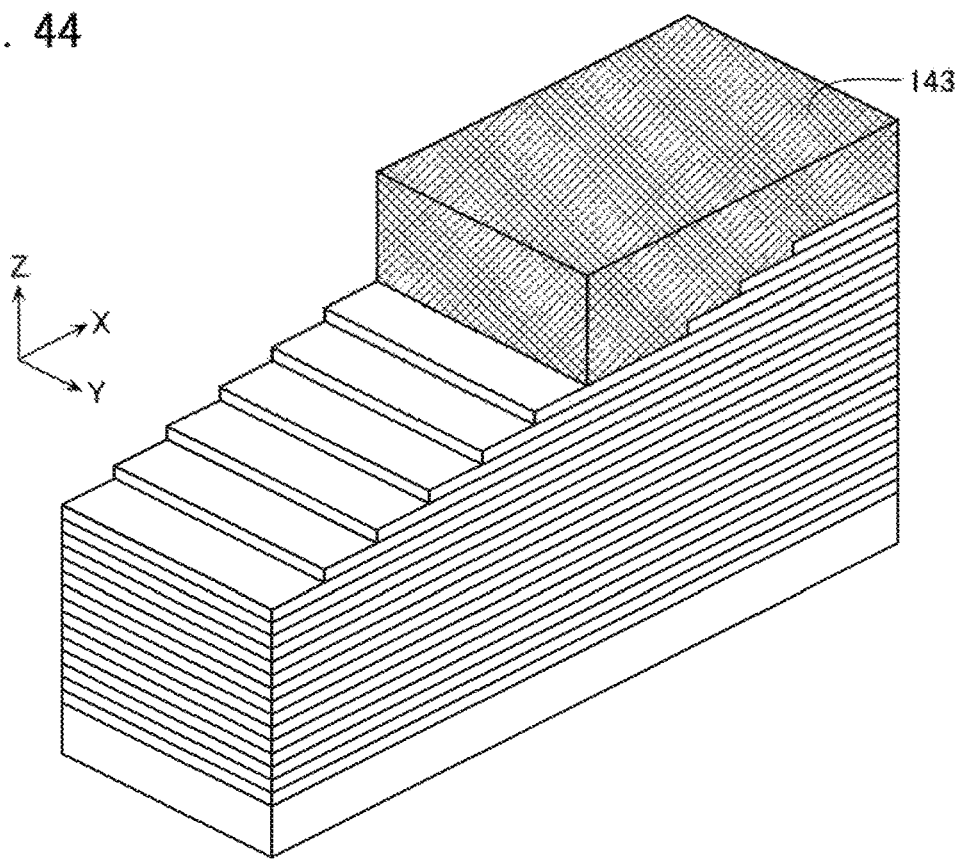

Next, as illustrated in FIG. 44, the photoresist 143 is slimmed in the X direction by one terrace of the contact unit 102*a*, using the isotropic etching such as the $O_2$ plasma treatment.

Figure 45:
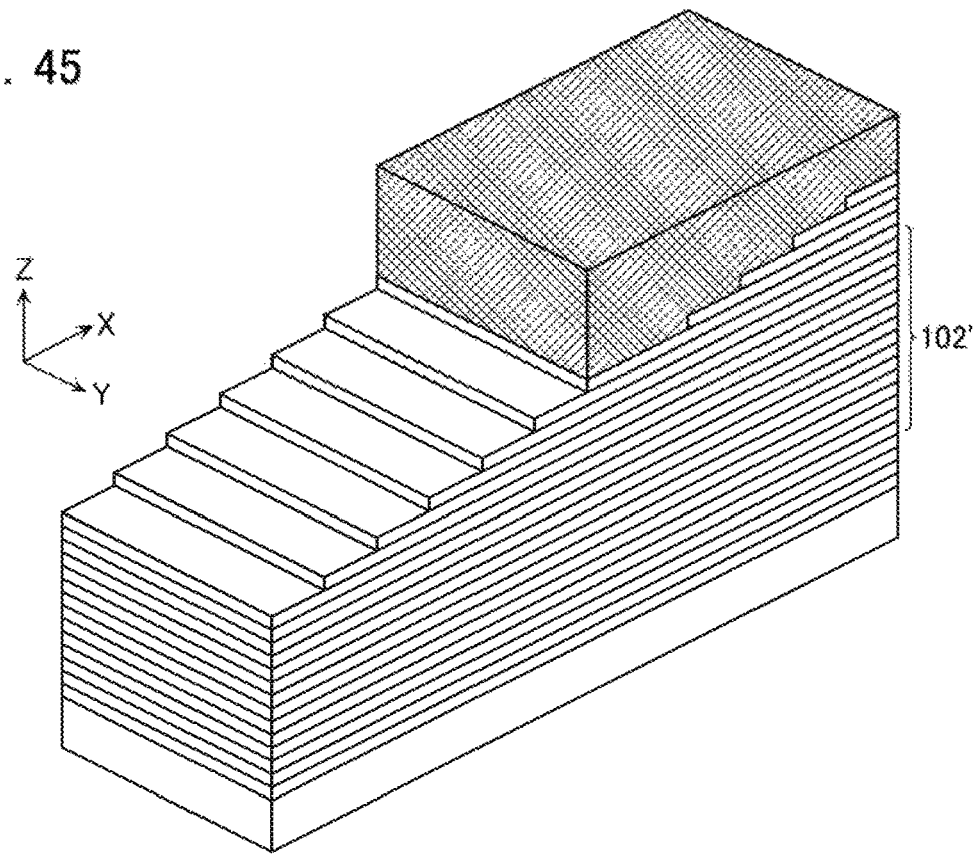

Next, as illustrated in FIG. 45, one laminate 102' is etched using the RIE. Thereby, the end of the laminate 102' is formed in a shape of a step extending in the X direction.

Figure 46:
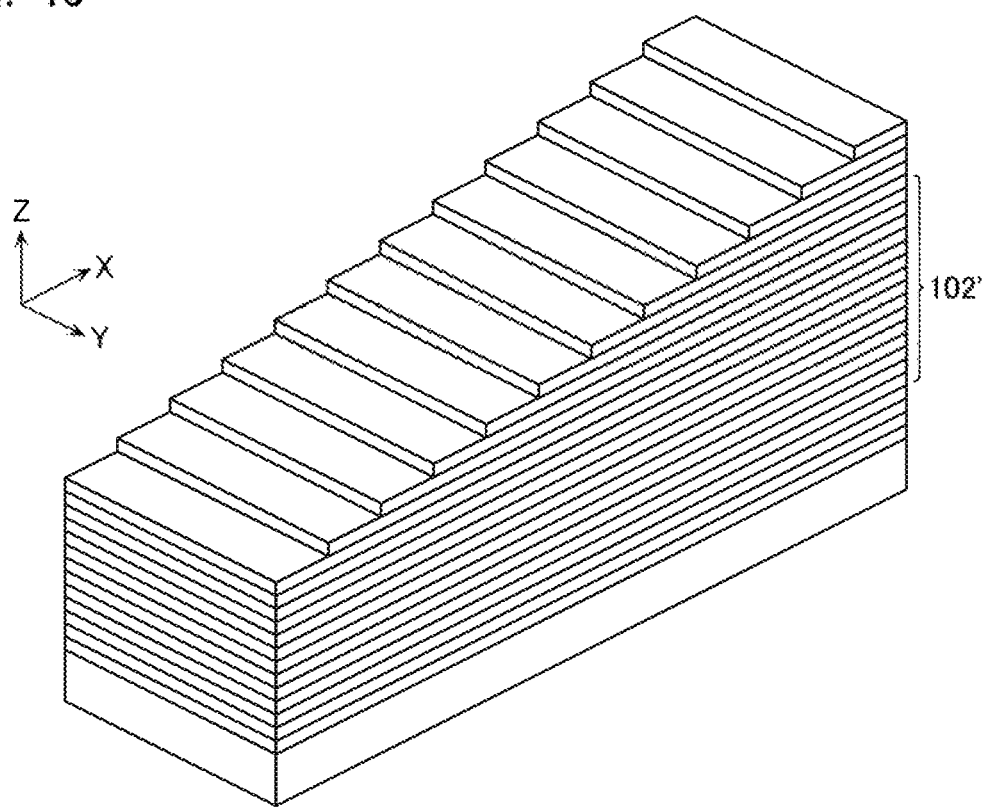

As such, slimming of the photoresist 143 illustrated in FIG. 44 and etching of the laminate 102' illustrated in FIG. 45 are repetitively executed in an allowable range of the film thickness of the photoresist 143. Thereby, as illustrated in FIG. 46, the end of the laminate 102' is formed in the shape of the step extending in the X direction, in the arrangement area of the terrace of the contact unit 102*a*. Next, the photoresist 143 is removed.

Figure 47:
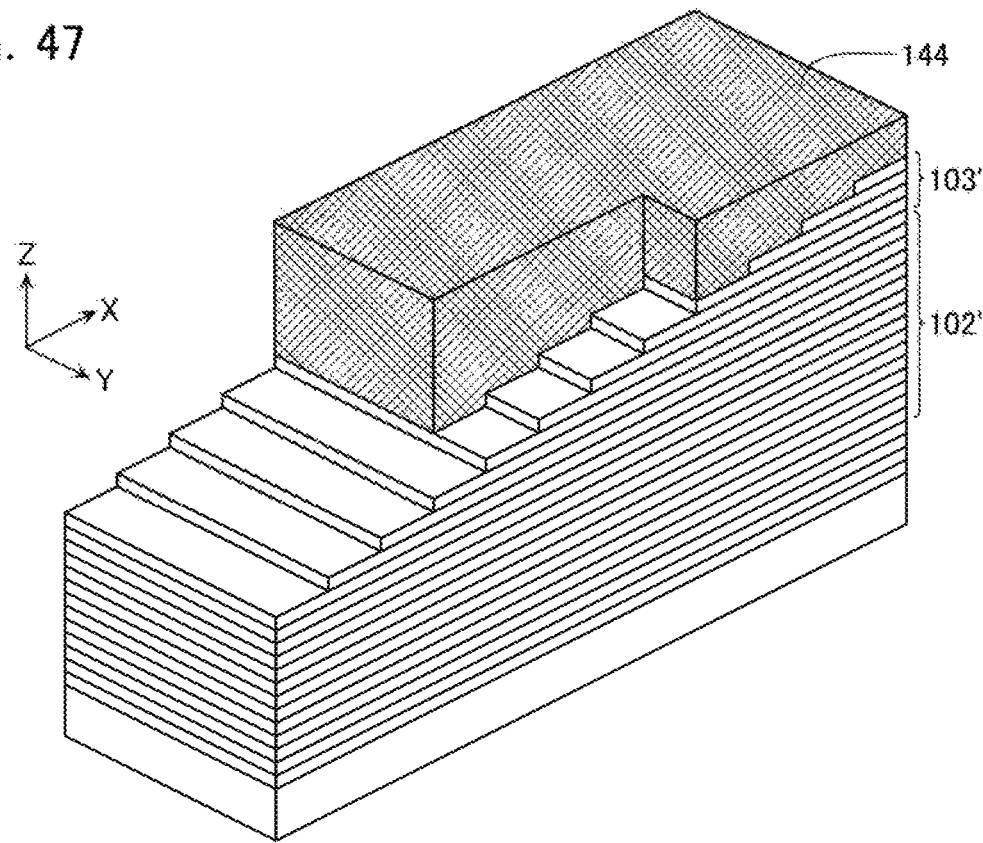

Next, as illustrated in FIG. 47, a photoresist 144 is laminated on the laminates 102' and 103' using the photolithography. The photoresist 144 has a pattern to etch one terrace of the contact unit 102*a* of the conductive layer 102 in the Y direction.

Figure 48:
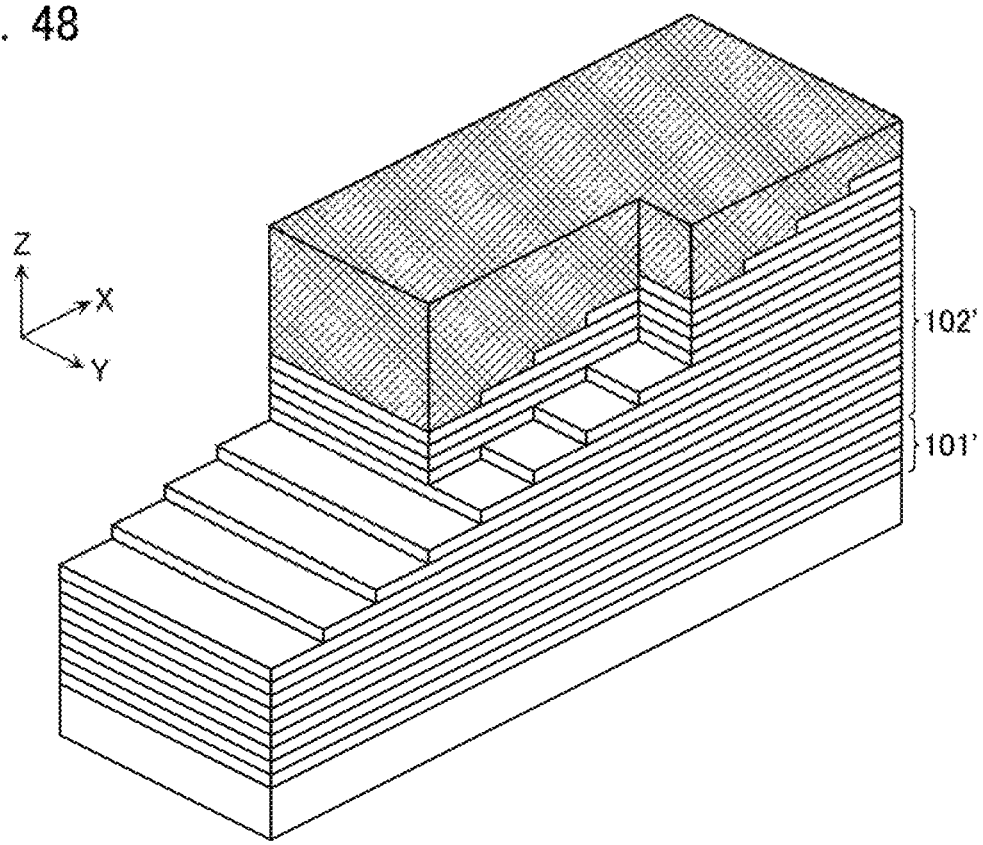

Next, as illustrated in FIG. 48, the laminates 101' and 102' are etched by the number of terraces (in the case of FIG. 48, the number corresponding to four layers) of the contact units 102*a* arranged in the X direction, using the RIE.

Figure 49:
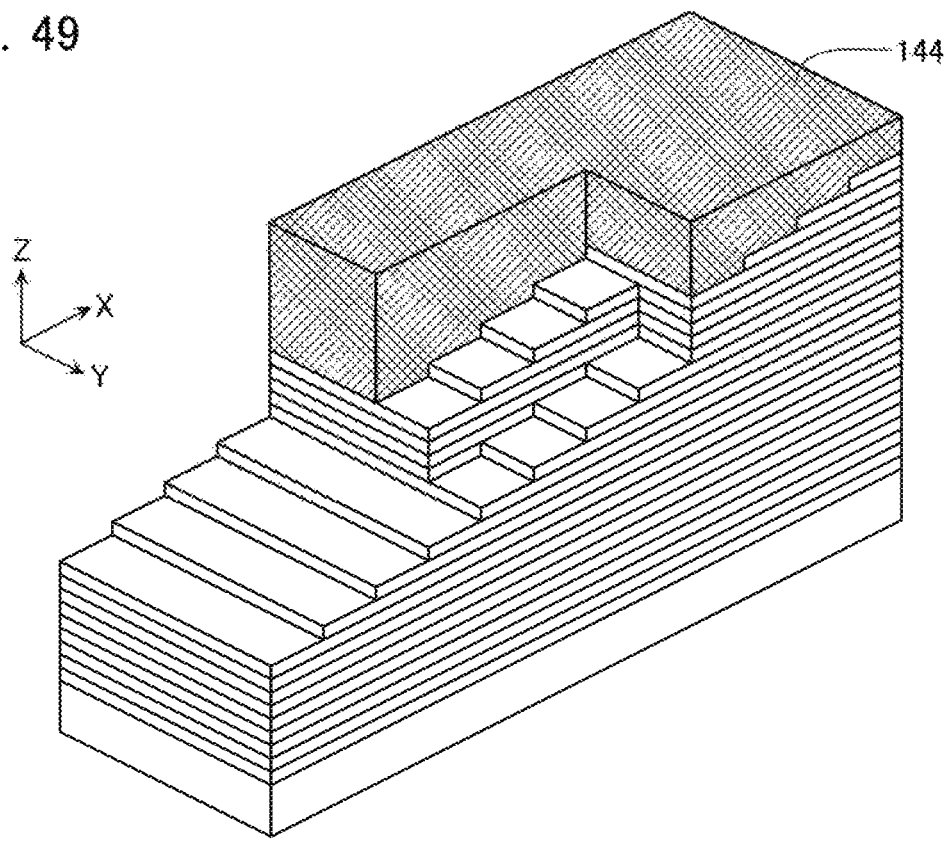

Next, as illustrated in FIG. 49, the photoresist 144 is slimmed in the Y direction by one terrace of the contact unit 102a, using the isotropic etching such as the $O_2$ plasma treatment.

Figure 50:
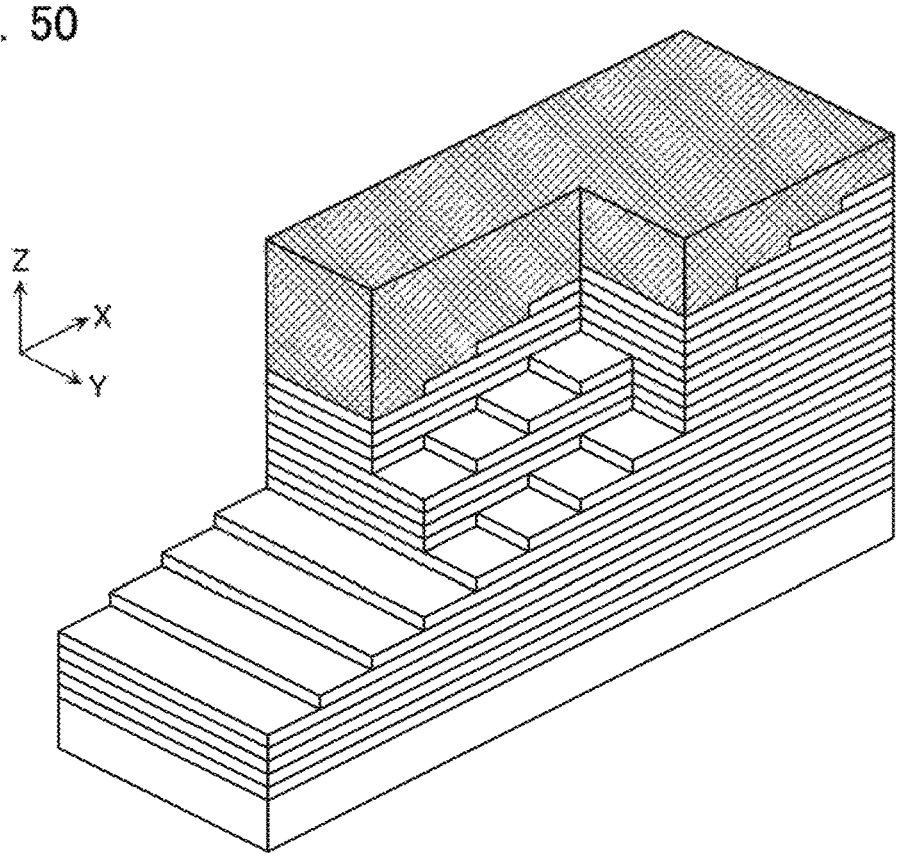
Figure 51:
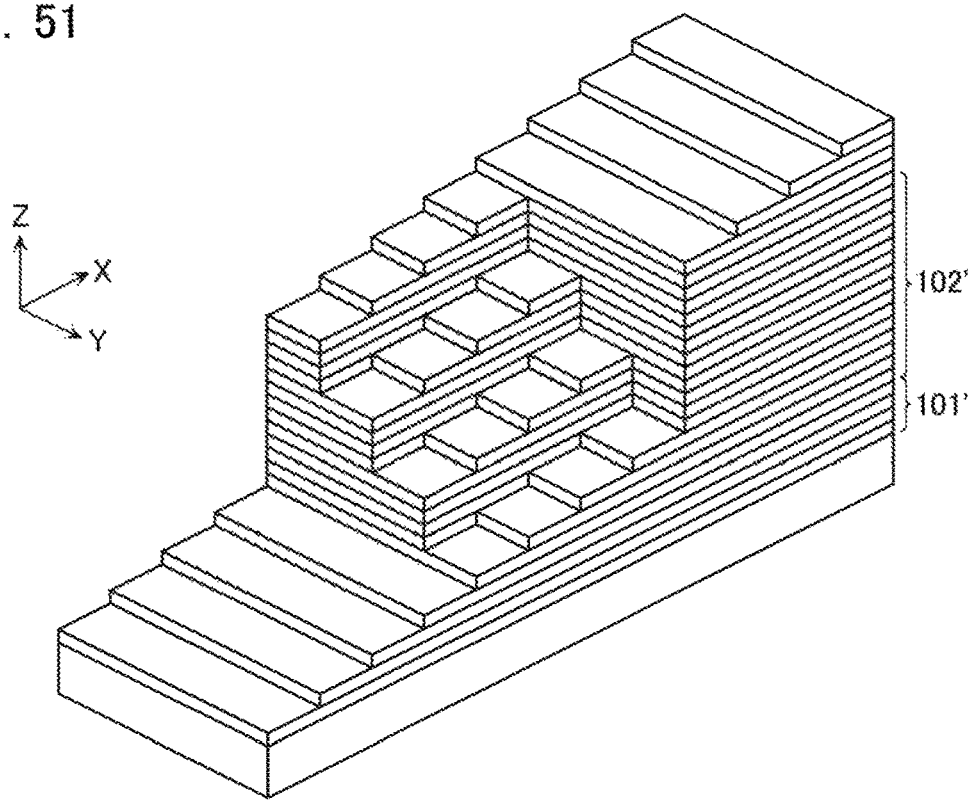

Next, as illustrated in FIG. 50, the laminates 101' and 102' are etched by the number of terraces (in the case of FIG. 50, the number corresponding to four layers) the contact units 102a arranged in the X direction, using the RIE. Thereby, the ends of the laminates 102' are formed in shapes of steps extending in both directions of the X direction and the Y direction.

As such, slimming of the photoresist 144 illustrated in FIG. 49 and etching of the laminates 101' and 102' illustrated in FIG. 50 are repetitively executed in an allowable range of the film thickness of the photoresist 144. Thereby, as illustrated in FIG. 50, the end of the contact unit 101a having the stepwise structure extending in the X direction and the end of the contact unit 102a having the stepwise structure extending in both directions of the X direction and the Y direction are formed.

Next, after the silicon oxide film is formed on the laminates 101' to 103', the silicon oxide film is flattened using the CMP. Next, formation of the memory transistor MT for the memory area 106 and formation of the via 108 for the contact area 107 are executed.

As such, another process for producing the contact units 101a to 103a is executed.

Others

Some embodiments of the present invention have been described. However, the embodiments are only exemplary and do not limit the scope of the invention. These novel embodiments can be carried out in a variety of other forms and various omissions, replacements, changes, and modifications can be made without departing from the gist of the invention. The embodiments and the modifications thereof are included in the scope and the gist of the invention and are included in the scope of the invention described in the claims.

What is claimed is:

1. A method of producing a semiconductor memory device, comprising:
    when three directions crossing each other are set to first, second, and third directions, respectively,
    laminating a plurality of first laminates and a plurality of second laminates on a semiconductor substrate in the third direction;
    forming ends of the plurality of first laminates in shapes of steps extending in the first direction; and
    forming ends of the plurality of second laminates in shapes of steps extending in both directions of the first direction and the second direction,
    wherein, during the formation of the ends of the plurality of second laminates in shapes of steps, a first resist is formed on the plurality of second laminates, anisotropic etching for the plurality of second laminates is repetitively executed after the first resist is are slimmed in the first direction by isotropic etching, a second resist is formed on the plurality of second laminates, and the anisotropic etching for the plurality of second laminates is repetitively executed after the second resist is slimmed in the second direction by the isotropic etching.

2. The method according to claim 1, wherein the ends of the plurality of first laminates are formed in shapes of steps, before the plurality of second laminates are laminated.

3. The method according to claim 1, wherein a plurality of third laminates are laminated on the plurality of second laminates, before the ends of the plurality of second laminates are formed in shapes of steps.

4. The method according to claim 3, wherein ends of the plurality of third laminates are formed in shapes of steps extending in the first direction, after the ends of the plurality of second laminates are formed in shapes of steps.

5. The method according to claim 1, wherein a plurality of third laminates are laminated on the plurality of second laminates, before the ends of the plurality of first laminates and the plurality of second laminates are formed in shapes of steps.

6. The method according to claim 5, wherein ends of the plurality of third laminates are formed in shapes of steps extending in the first direction, before the ends of the plurality of first laminates and the plurality of second laminates are formed in shapes of steps.

7. The method according to claim 1, wherein grooves using the first direction as a longitudinal direction and the third direction as a depth direction are formed in the plurality of first laminates.

8. The method according to claim 1, wherein a silicon oxide film and a silicon nitride film or an amorphous silicon film are laminated alternately, when the plurality of first laminates and the plurality of second laminates are laminated.

* * * * *